United States Patent
Simon et al.

(10) Patent No.: US 8,204,138 B2
(45) Date of Patent: Jun. 19, 2012

(54) SYMBOL-BASED SIGNALING DEVICE FOR AN ELECTROMAGNETICALLY-COUPLED BUS SYSTEM

(75) Inventors: Thomas D. Simon, Marlborough, MA (US); Rajeevan Amirtharajah, Providence, RI (US); Nandu J. Marketkar, Boylston, MA (US); Thomas F. Knight, Jr., Belmont, MA (US); John R. Benham, Westborough, MA (US)

(73) Assignee: Intel Corporation, Santa Clara, CA (US)

( * ) Notice: Subject to any disclaimer, the term of this patent is extended or adjusted under 35 U.S.C. 154(b) by 2581 days.

(21) Appl. No.: 09/792,502

(22) Filed: Feb. 23, 2001

(65) Prior Publication Data

US 2001/0053187 A1     Dec. 20, 2001

Related U.S. Application Data

(63) Continuation of application No. 09/714,244, filed on Nov. 15, 2000, now Pat. No. 6,697,420.

(51) Int. Cl.
*H04L 25/00* (2006.01)

(52) U.S. Cl. ......... 375/258; 375/212; 375/220; 710/110

(58) Field of Classification Search .................. 375/212, 375/220, 221, 257, 258; 370/437, 438; 710/110, 710/119, 124, 129, 131
See application file for complete search history.

(56) References Cited

U.S. PATENT DOCUMENTS

| | | | |
|---|---|---|---|
| 3,516,065 A | 6/1970 | Bolt et al. | |
| 3,619,504 A | 11/1971 | De Veer et al. | |
| 3,764,941 A | 10/1973 | Nick | |
| 3,786,418 A | 1/1974 | Nick | |
| 3,835,252 A | 9/1974 | Ananiades et al. | |
| 4,641,322 A | 2/1987 | Hasegawa | |
| 4,825,450 A | 4/1989 | Herzog | |
| 4,904,879 A | 2/1990 | Rudy, Jr. et al. | |
| 5,365,205 A | 11/1994 | Wong | |
| 5,574,273 A * | 11/1996 | Nakagawa et al. | 235/492 |
| 5,621,913 A | 4/1997 | Tuttle et al. | |
| 5,629,838 A | 5/1997 | Knight et al. | |
| 5,638,402 A | 6/1997 | Osaka et al. | |
| 6,005,895 A | 12/1999 | Perino et al. | |
| 6,009,488 A | 12/1999 | Kavipurapu | 710/105 |
| 6,016,086 A * | 1/2000 | Williamson et al. | 333/109 |
| 6,084,883 A | 7/2000 | Norrell et al. | |

(Continued)

FOREIGN PATENT DOCUMENTS

DE     15 74 593 A     7/1971

(Continued)

OTHER PUBLICATIONS

Epoxy Resin @ 3Dchem.com—Molecule of the Month for Mar. 2007.*

(Continued)

*Primary Examiner* — Dac Ha
(74) *Attorney, Agent, or Firm* — Trop, Pruner & Hu, P.C.

(57) ABSTRACT

The present invention provides an apparatus for transferring data through an electromagnetic coupler. The apparatus comprises a transmitter to encode a first plurality of bits into a symbol, a receiver to decode a transferred symbol into a second plurality of bits; and a coupling element having a geometry that provides robust electromagnetic transfer of the symbol and the transferred symbol. For one embodiment of the apparatus, the coupling element has a zig-zag geometry.

20 Claims, 19 Drawing Sheets

U.S. PATENT DOCUMENTS

| | | | |
|---|---|---|---|
| 6,088,741 | A | 7/2000 | Murata |
| 6,091,739 | A | 7/2000 | Simonovich et al. |
| 6,111,476 | A | 8/2000 | Williamson |
| 6,446,152 | B1 | 9/2002 | Song et al. |
| 6,449,308 | B1 | 9/2002 | Knight, Jr. et al. |
| 6,496,886 | B1 | 12/2002 | Osaka et al. |
| 6,496,889 | B1 * | 12/2002 | Perino et al. ............ 710/110 |
| 6,498,512 | B2 | 12/2002 | Simon et al. |
| 6,519,292 | B1 * | 2/2003 | Sakoda et al. ............ 375/295 |
| 6,546,055 | B1 | 4/2003 | Schmidl et al. |

FOREIGN PATENT DOCUMENTS

| | | |
|---|---|---|
| EP | 0 282 101 | 9/1988 |
| EP | 0 447 001 A2 | 9/1991 |
| WO | WO 00/72163 A1 | 11/2000 |

OTHER PUBLICATIONS

Ramin Farjad-Rad et al., "A 0.3-μm CMOS 9-Gb/s 4-PAM Serial Link Transceiver", IEEE Journal of Solid-State Circuits, vol. 35, No. 5, May 2000, pp. 757-764.

Chih-Kong Ken Yang et al., "A 0.5-μm CMOS 4.0 Gbit/s Serial Link Transceiver with Data Recovery Using Oversampling", IEEE Journal of Solid-State Circuits, vol. 33, No. 5, May 1998, pp. 713-722.

Hideki Osaka, "XTL Evaluation System, Evaluation Memory Sub-System: chip (HS-TEG:High Speed Test Engineering Group) and DIMM", Intel-Hitachi, SDL601-XTL-0-073 DMX-005, Sep. 15, 2000, pp. 14 total.

Hideki Osaka, "High Performance Memory Interface for DDR-SDRAM II: XTL (Crosstalk Transfer Logic", Intel-Hitachi, SDL601-XTL-0-074 DMX-006, Sep. 15, 2000, pp. 20 total.

* cited by examiner

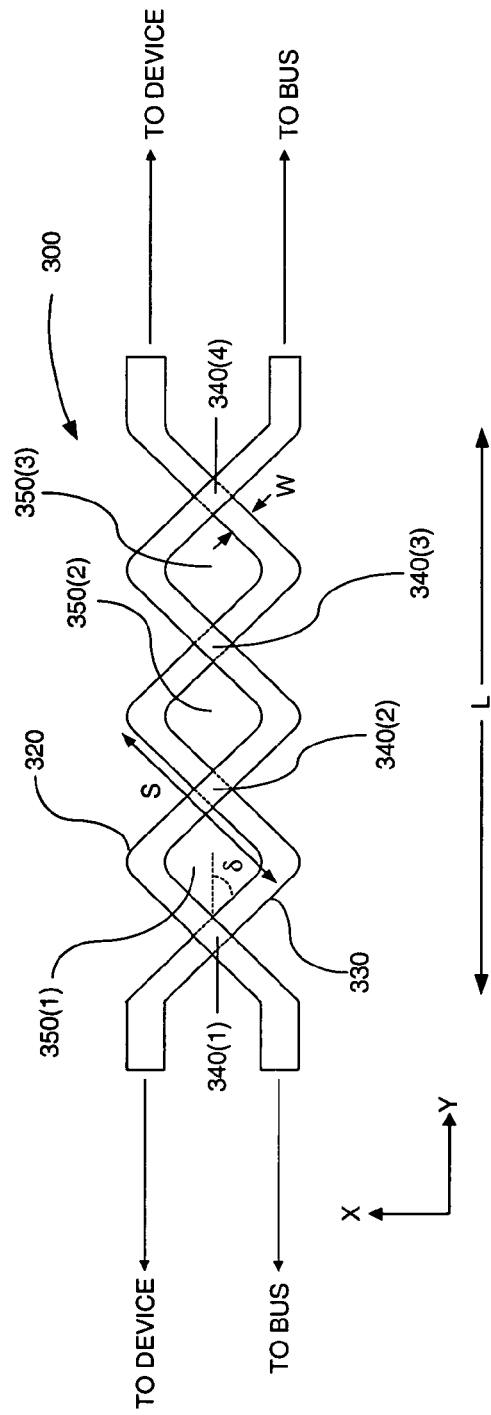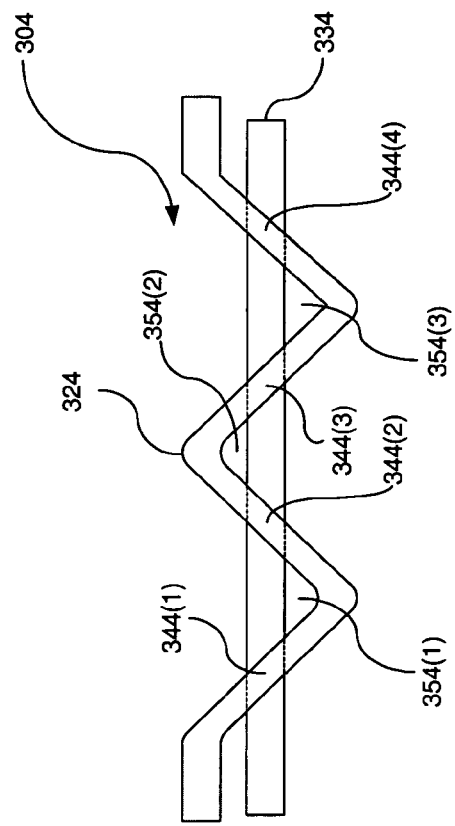

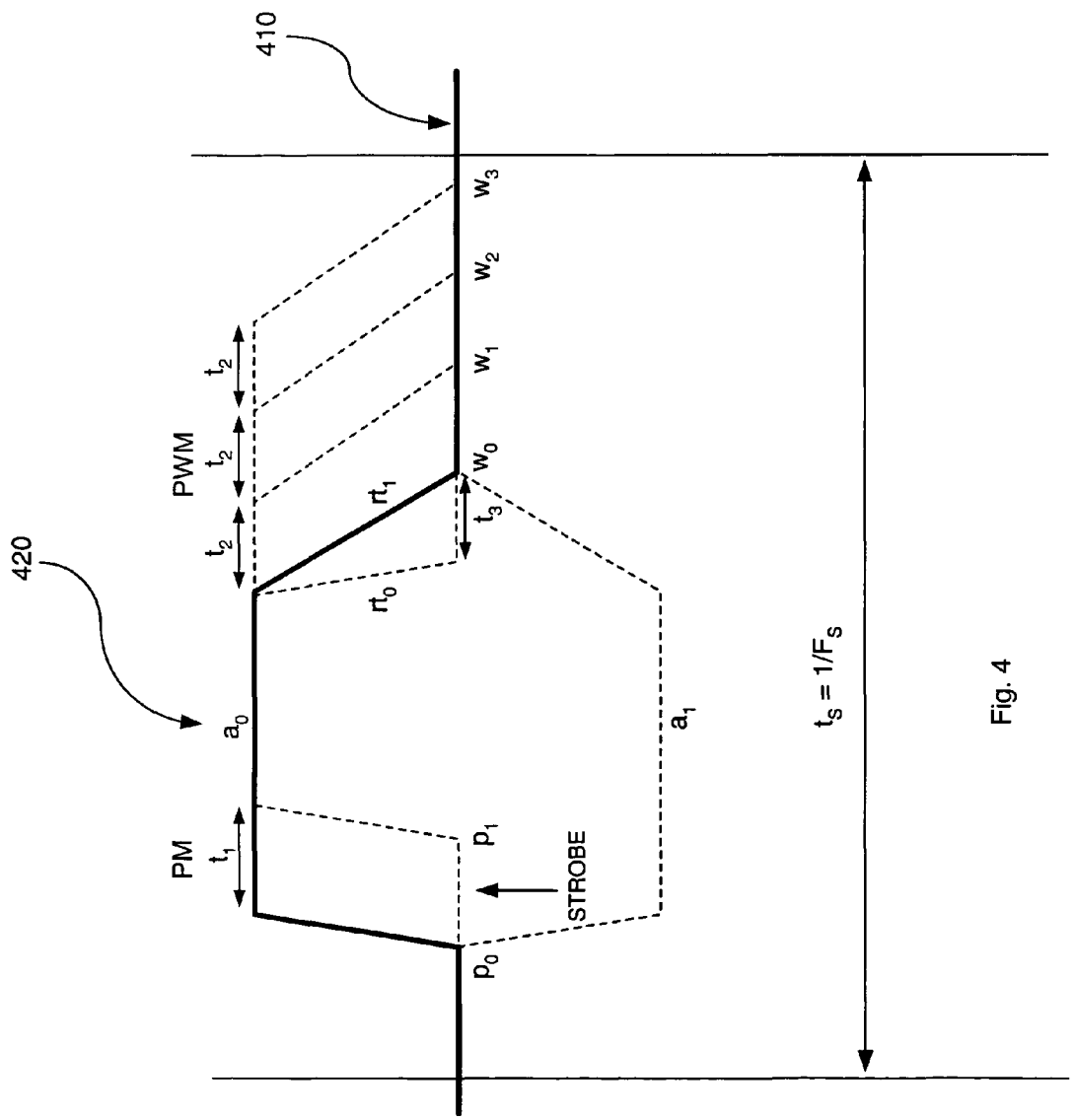

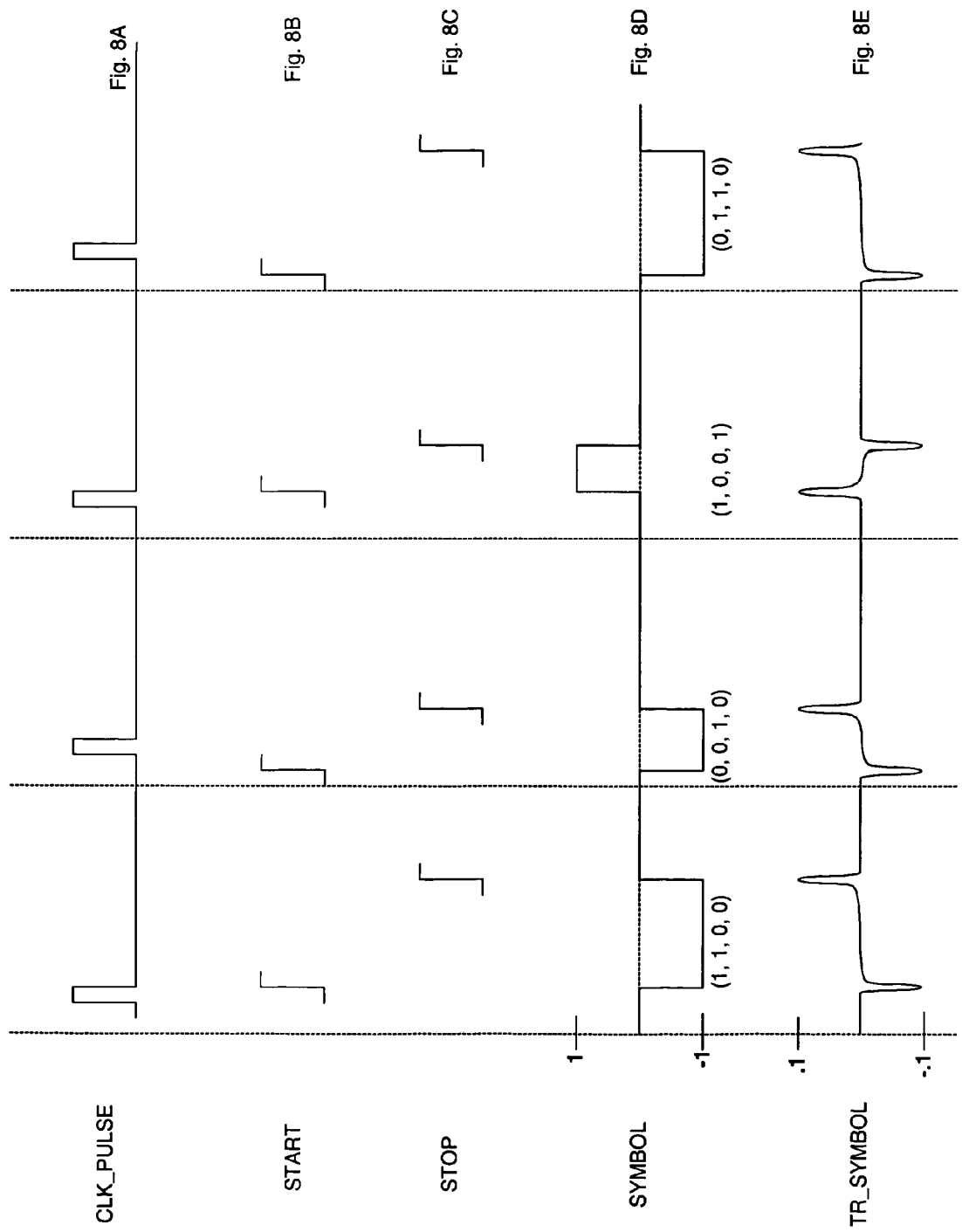

SYMBOL-BASED SIGNALING DEVICE FOR AN ELECTROMAGNETICALLY-COUPLED BUS SYSTEM

RELATED PATENT APPLICATIONS

This patent application is a continuation of U.S. patent application Ser. No. 09/714,244, entitled "Symbol-Based Signaling For an Electromagnetically-Coupled Bus System" and filed on Nov. 15, 2000 now U.S. Pat. No. 6,697,420.

BACKGROUND OF THE INVENTION

1. Technical Field

The present invention relates to mechanisms for communicating digital data, and in particular to mechanisms for communicating digital data in an electromagnetically-coupled bus system.

2. Background Art

Digital electronics systems, such as computers, must move data among their component devices at increasing rates to take full advantage of the higher speeds at which these component devices operate. For example, a computer may include one or more processors that operate at frequencies of a gigahertz (GHz) or more. The data throughput of these processors outstrips the data delivery bandwidth of conventional systems by significant margins. This discrepancy is mitigated somewhat by intelligent caching of data to maintain frequently used data on the processor chip. However, even the best caching architecture can leave a processor under-utilized. Similar problems arise in any digital system, such as communication networks, routers, backplanes, I/O buses, portable device interfaces, etc., in which data must be transferred among devices that operate at ever higher frequencies.

The digital bandwidth (BW) of a communication channel may be represented as:

$$BW = F_S N_S.$$

Here, $F_S$ is the frequency at which symbols are transmitted on a channel and $N_S$ is the number of bits transmitted per symbol per clock cycle ("symbol density"). Channel refers to a basic unit of communication, for example a board trace in single ended signaling or the two complementary traces in differential signaling. For a typical bus-based system, $F_S$ is on the order of 200 MHz, $N_S$ is one, and the bus width (number of channels) is 32, which provides a bus data rate of less than one gigabyte per second.

Conventional strategies for improving BW have focused on increasing one or both of the parameters $F_S$ and $N_S$. However, these parameters cannot be increased without limit. For example, a bus trace behaves like a transmission line for frequencies at which the signal wavelength becomes comparable to the bus dimensions. In this high frequency regime, the electrical properties of the bus must be carefully managed. This is particularly true in standard multi-drop bus systems, which include three or more devices that are electrically connected to each bus trace through parallel stubs. The connections can create discontinuities in the trace impedance, which scatter high frequency signals. Interference between scattered and unscattered signals can significantly reduce signal reliability. The resulting noise can be reduced through careful impedance matching of the system components. However, impedance matching requires the use of precision components, which increases the costs of these systems. In addition to impedance discontinuities, connections to bus traces may also affect system performance by adding capacitance. Capacitance can slow signal propagation speed and lower the trace impedance, which may require larger driver circuits with increased power consumption.

Computer systems based on RAMBUS™ DRAM (RDRAM) technology represent another approach to high speed signaling. For these systems, devices are mounted on daughter cards, which are connected in series with the bus through costly, tightly matched connectors. The impedance-matched series connections eliminate the impedance discontinuities of parallel stubs, but the signal path must traverse each of the daughter cards, increasing its length. In addition, the different daughter card components must be impedance matched to each other and the connectors, and the parasitic capacitances of these components, all of which touch some portion of the bus, further affect the signal propagation speed, impedance, driver size, and power dissipation. These effects taken together seriously constrain the total number of components (or bus capacity) that can be placed on one bus.

Yet another strategy for addressing the frequency limits of conventional bus systems is to replace the direct electrical connection between a bus trace and a device with an indirect, e.g. electromagnetic, coupling. For example, U.S. Pat. No. 5,638,402 discloses a system that employs electromagnetic couplers. The impact of an electromagnetic coupler on the trace impedance depends strongly on the fraction of signal energy it transfers between its coupling components, i.e. its coupling coefficient. A coupler having a large coupling coefficient and/or length transfers a large fraction of the signal energy it samples to its associated device. Large energy transfers can degrade the continuity of the trace impedance as much as standard direct electrical connections. They can also attenuate the signal energy rapidly, and on multi-drop buses, little signal energy may be available to devices that are farther from the signal source. On the other hand, coupling coefficients that are too small or lengths that are too short result in low signal to noise ratios at the devices. In addition, the coupling coefficient is very sensitive to the relative positions of the coupling components. Variations in the relative positions can increase noise on the bus trace or reduce the transferred signal relative to non-scalable noise according to whether the distance decreases or increases, respectively.

Practical BW limits are also created by interactions between the BW parameters, particularly at high frequencies. For example, the greater self-induced noise associated with high frequency signaling limits the reliability with which signals can be resolved. This limits the opportunity for employing higher symbol densities.

Modulation techniques have been employed in some digital systems to encode multiple bits in each transmitted symbol, thereby increasing $N_S$. Use of these techniques has been largely limited to point-to-point communication systems, particularly at high signaling frequencies. Because of their higher data densities, encoded symbols can be reliably resolved only in relatively low noise environments. Transmission line effects limit the use of modulation in high frequency communications, especially in multi-drop environments. For example, RDRAM based systems may use four voltage levels (called QRSL) to increase $N_S$ to two. More aggressive modulation (amplitude modulation or other schemes) is precluded by the noise environment.

The present invention addresses these and other issues associated with communication of data in digital electronic systems.

BRIEF DESCRIPTION OF THE DRAWINGS

The present invention may be understood with reference to the following drawings, in which like elements are indicated by like numbers. These drawings are provided to illustrate selected embodiments of the present invention and are not intended to limit the scope of the invention.

FIGS. 3A-3E represent embodiments of the electromagnetic coupler of FIGS. 2A and 2B, and their use in multi-drop bus systems.

FIG. 4 is a schematic representation of a symbol that represents multiple bits of data through various modulation techniques that are suitable for use with the present invention.

FIGS. 8A-8E represent signals at various stages of data transmission for one embodiment of bus system 200.

DETAILED DESCRIPTION OF THE INVENTION

The following discussion sets forth numerous specific details to provide a thorough understanding of the invention. However, those of ordinary skill in the art, having the benefit of this disclosure, will appreciate that the invention may be practiced without these specific details. In addition, various well-known methods, procedures, components, and circuits have not been described in detail in order to focus attention on the features of the present invention.

The present invention supports high bandwidth communication by providing greater control over the frequency and encoding mechanisms employed to transfer data. A system in accordance with the present invention includes a data channel, such as a bus, having substantially uniform electrical properties for transferring signals among devices that are coupled through the data channel. The uniform electrical properties are supported by an electromagnetic coupling scheme that allows higher frequency signaling to be employed without significantly increasing noise attributable to transmission line effects. The scheme employs balanced electromagnetic couplers to provide reliable signal transfer between the communication channel and the devices without significantly impacting the impedance of the communication channel. The resulting cleaner noise environment allows greater flexibility in selecting an encoding scheme to represent the data.

For one embodiment of the invention, a balanced electromagnetic coupler includes first and second coupler components separated by a dielectric medium and having a coupling coefficient in a specified range. At least one of the coupler components has a geometry that reduces the sensitivity of the coupling coefficient to variations in the relative positioning of the coupling components. The length of the coupler may be selected to provide sufficient signal energy transfer without limiting the system bandwidth.

For another embodiment of the invention, devices transfer data to and from a multi-drop bus through electromagnetic couplers, using a selected modulation scheme. The electromagnetic couplers allow the devices to sample a relatively small portion of the signal energy on the bus, which mitigates the impact of the devices on the electrical properties of the bus. The modulation schemes employed are selected to balance the symbol density with susceptibility to inter and intra-symbol interference in the impedance environment provided by the electromagnetically coupled devices.

Figure 1:
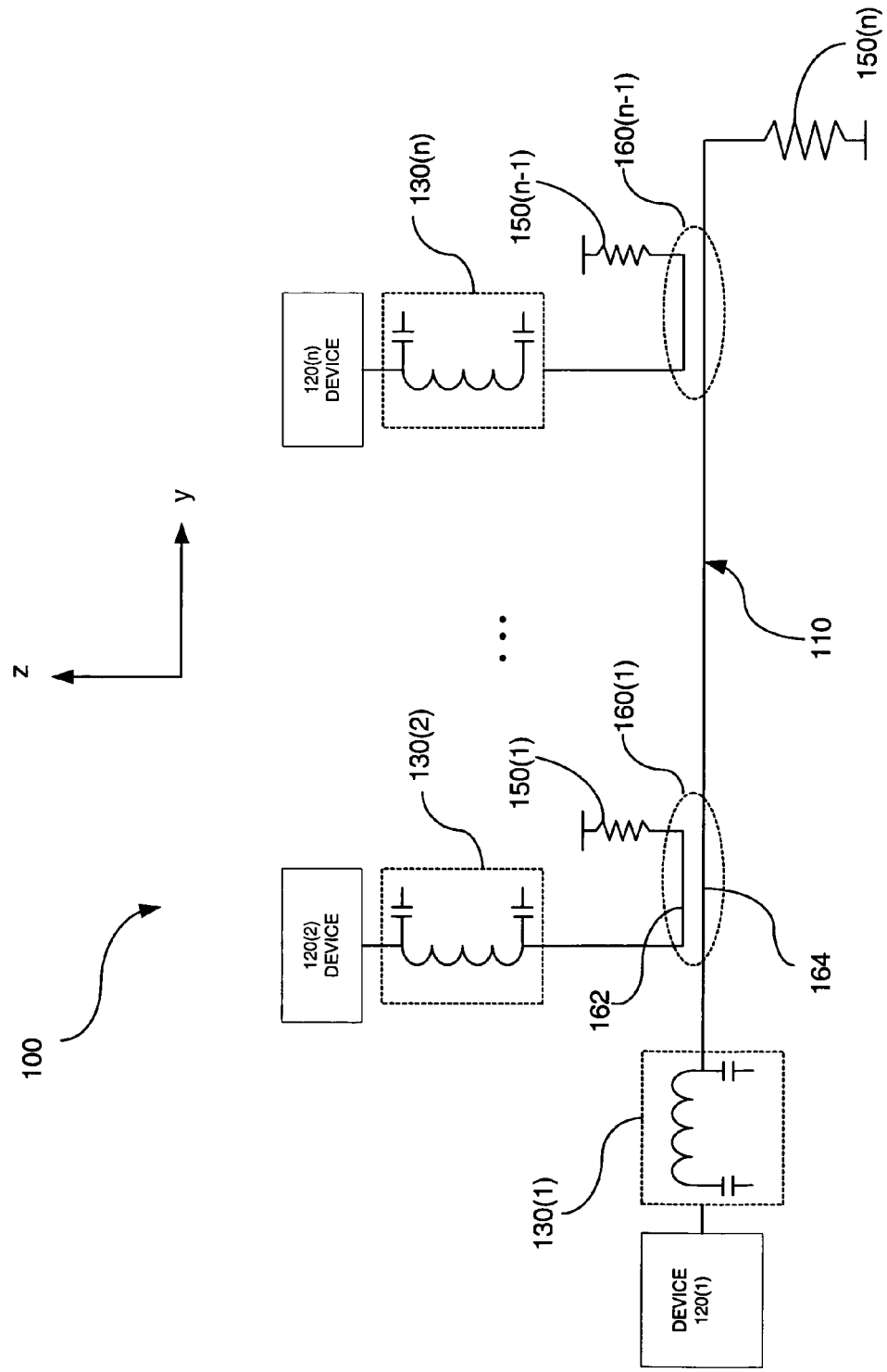
FIG. 1 is a block diagram of a conventional multi-drop bus system that employs electromagnetic couplers.

FIG. 1 is a block diagram representing the electrical properties of a multi-drop bus system 100. System 100 includes a bus 110 to transfer data among various devices 120(1)-120(n) (generically, "devices 120"). Device 120(1) is electrically coupled to bus 110, while devices 120(2)-120(n) are coupled to bus 110 through associated electromagnetic couplers 160(1)-160(n−1), respectively. In the following discussion, electrical coupling refers to a relatively low resistance electrical path between bus 110 and device 120(1) that is capable of transmitting signals down to zero frequency (DC). Also shown in FIG. 1 are parasitics 130, which may be associated with packages for devices 120 or connectors, when devices 120 are provided on separate daughter cards.

For multi-drop bus systems, multiple electromagnetic couplers 160 introduce impedance discontinuities along bus 110 that make impedance matching more difficult. Signals reflected from impedance discontinuities interfere with other signals (inter-symbol and intra-symbol interference). The noise environment created by couplers 160 and parasitics 130 (where present) limits the signaling frequencies and the symbol densities that may be employed on system 100.

Electromagnetically coupled buses similar to system 100 are disclosed in U.S. Pat. Nos. 5,638,402, 3,516,065 and 3,619,504. The '402 patent discloses electromagnetic couplers 160 having parallel plate geometries ("parallel coupling portions") and a "backward cross-talk coefficient" ($K_b$) of approximately 0.3. $K_b$ represents the relative amplitude of a counter-propagating signal induced across coupler 160 by a primary signal. A $K_b$ value of 0.3 implies strong signal scattering on bus 110 and large signal energy loss per coupler. It also imposes large dynamic range requirements on the receivers of devices 120. Even $K_b$ values on the order of 0.2 represent significant signal attenuations and noise problems on bus 110.

In addition to their strengths, the coupling coefficients of parallel plate couplers 160 are very sensitive to variations in horizontal (x, y) and vertical (z) alignment of the coupler components (162 and 164). One solution is to embed both sides of electromagnetic coupler 160 in a circuit board, with a precision sufficient to guarantee the coupling coefficient falls in a targeted range. This precision increases the costs of system 100. Moreover, it requires a connector, as represented by parasitics 130 to accommodate daughter cards.

Parallel plate couplers 160 are also susceptible to noise problems if they are implemented in a differential signaling scheme, where complementary signals are driven on pairs of bus traces. For these systems, a pair of couplers 160 transfers the complementary signals to a differential receiver in device 120. The sensitivity of parallel plate couplers 160 to variations in the positions of their components increases the likelihood that coupler pairs have mismatched coupling coefficients. This results in differential noise, which undermines the benefits of differential signaling. Further, unless the couplers are spaced sufficiently far apart (increasing the circuit board area needed to support them), the complementary signals can cross couple, with a resulting loss in signal to noise ratio.

Figure 2A:
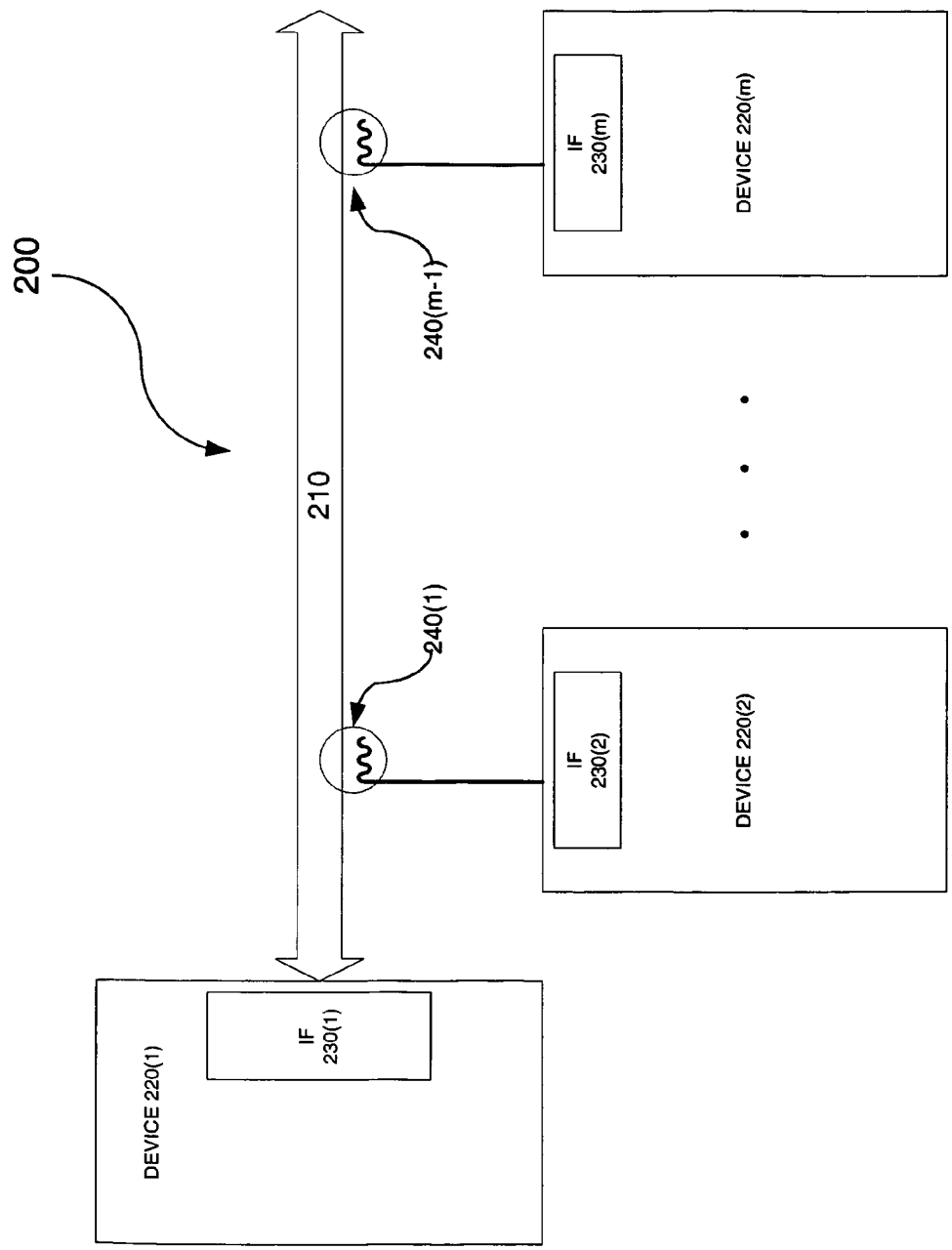
FIG. 2A is a block diagram of an electromagnetically-coupled multi-drop bus system in accordance with the present invention.

FIG. 2A is a block diagram representing one embodiment of a system 200 in accordance with the present invention. System 200 may be a computer system, but persons skilled in the art of digital communication and having the benefit of this disclosure will recognize that benefits of the present invention may be realized in any system that requires high bandwidth data transfers.

For system 200, devices 220(1)-220(m) (generically, "device 220") communicate through a bus 210. For this purpose, devices 220(1)-220(m) include interfaces 230(1)-230(m), respectively, to transfer signals to and receive signals from bus 210. Interfaces 230(2)-230( m) communicate with bus 210 through associated electromagnetic couplers 240(1)-240(m−1), respectively (generically, "electromagnetic coupler 240"). Electromagnetic couplers 240 are balanced to limit the impact of devices 220 on the electrical properties of bus 210, while providing reliable signal transmission between devices 220 and bus 210. For example, the coupling coefficients of electromagnetic couplers 240 are selected to transfer sufficient signal energy between bus 210 and devices 220 to maintain signal to noise margins, while limiting signal reflections on bus 210 and the too rapid attenuation of signal energy on bus 210 (signal energy bleed-off). Balanced electromagnetic couplers 240 typically employ coupling coefficients in the range of 0.1 to 0.4, e.g. $K_b$=0.05 to 0.2. The geometries of electromagnetic couplers 240 may be chosen to maintain these selected coupling coefficients against variations in the relative positioning of bus and device side coupling components, 242 and 244, respectively (FIG. 2B).

Both the energy transferred by an electromagnetic coupler and the maximum effective signaling frequency supported by a system that employs electromagnetic couplers depend on the coupler length. In addition, longer couplers take up more space and entail larger system costs.

The signal energy transferred by coupler 240 is proportional the integral of the square of the induced signal waveform over its duration. The induced signal waveform is determined by $K_b$, the amplitude of the signal waveform on the bus trace and the length of the coupler. For a given value of $K_b$, the longer the coupler, the more of the sampled signal energy it transfers. In addition, if symbols are driven on bus 210 at a sufficiently high frequency, the symbol period may be shorter than the duration of the induced waveform. Under these circumstances, coupler 240 can mix energy from two or more symbols i.e. the symbols interfere, and this interference degrades the signal to noise ratio. For these reasons, the length of coupler 240 should be long enough to provide adequate signal energy to the device without generating inter-symbol interference or excessive energy bleed-off along bus 210.

Figure 2B:
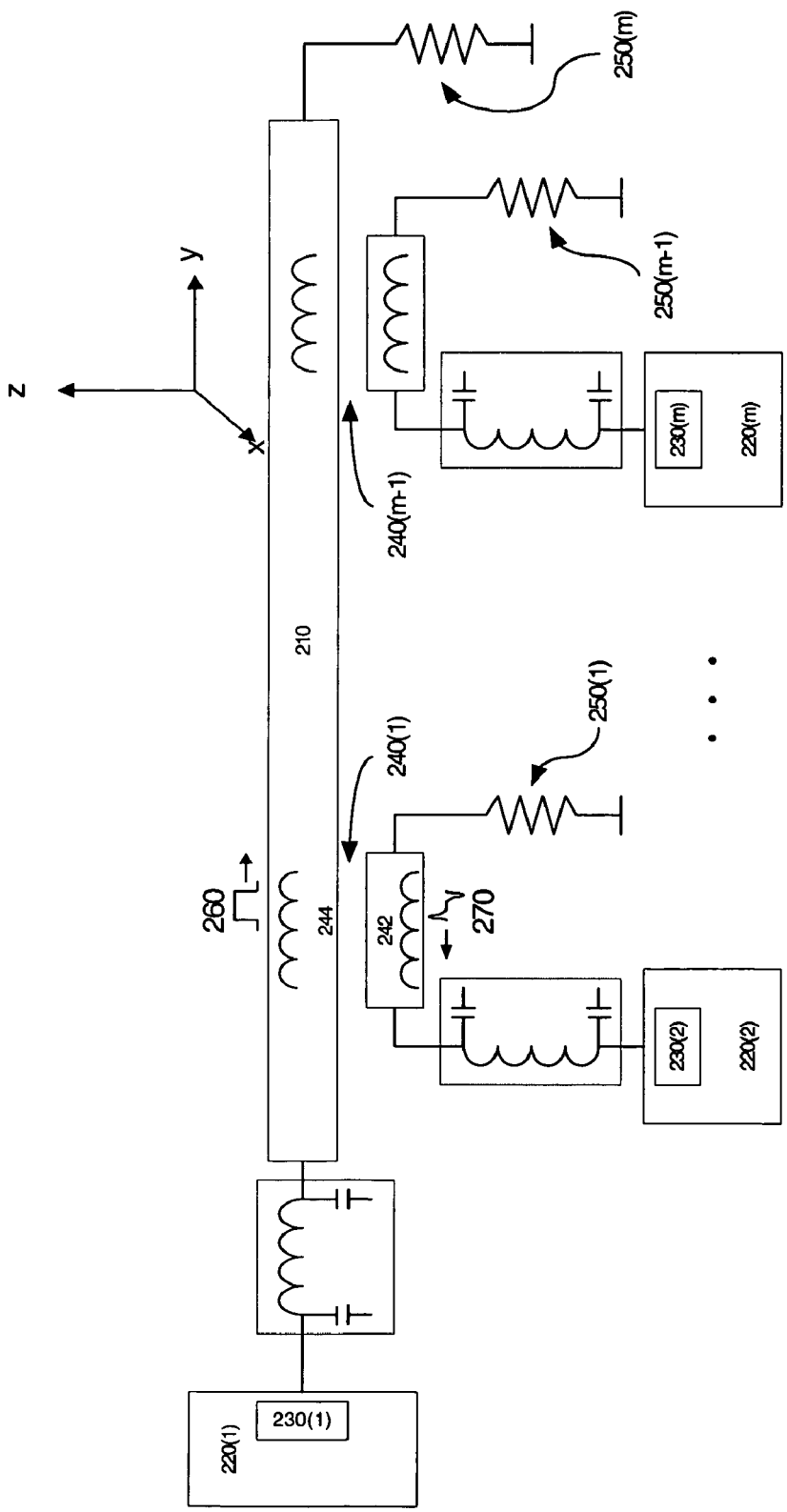
FIG. 2B is a block diagram representing the electrical properties of one embodiment of the electromagnetically-coupled bus system of FIG. 2A.

FIG. 2B is a schematic representation of the electrical properties of system 200. Signals are transmitted electromagnetically between a device, e.g. device 220(2), and bus 210 through electromagnetic coupler 240(1). In the following discussion, electromagnetic coupling refers to the transfer of signal energy through the electric and magnetic fields associated with the signal. Electromagnetic coupling includes both a capacitive component, associated with the electric field of the signal, and an inductive component, associated with the magnetic field of the signal. For example, $K_b$ is related to the inductive coupling coefficient ($K_L$) and capacitive coupling coefficient ($K_C$) as follows:

$$K_b = 0.25(K_L + K_C)$$

Here, $K_L$ is the ratio of the mutual inductance per unit length between the coupler components to the geometric mean of the self-inductances of the coupler components, and $K_C$ is the ratio of the mutual capacitance per unit length between the coupler components to the geometric mean of the self-capacitances per unit length of the coupler components.

The effects of the capacitive and inductive contributions on the energy transferred across coupler 240 vary with signal frequency. In general, the relative contribution of the inductive component becomes more pronounced with increasing signal frequency. For example, the presence of a significant inductive component may be used to provide directionality for signals at higher frequencies. In addition, electromagnetic coupler 240 behaves like a distributed device rather than a lumped device. The distributed nature of both capacitive and inductive aspects of coupler 240 become more pronounced at higher frequencies, when the signal wavelengths become comparable to the physical dimensions of coupler 240.

The use of electromagnetic couplers 240 with suitably selected coupling coefficients significantly reduces the impedance discontinuities in system 200 relative to those in systems that rely on electrical connections or unbalanced electromagnetic couplers. Further, providing electromagnetic couplers 240 with geometries that are relatively insensitive to variations in the positions of device and bus side components 242 and 244, respectively, allows the balanced coupling coefficients to be maintained without need for costly, precision manufacturing. The more uniform impedance of bus 210 provides a cleaner signal environment in which to transmit data. Modulation schemes employed to encode this data in accordance with the present invention reflect both the cleaner noise environment of bus 210 and the effects of couplers 240 on the waveforms they transfer.

For one embodiment of the invention, electromagnetic coupler 240 transfers approximately 5-10% of the signal amplitude on bus 210 to its corresponding device 220. This corresponds to less than 1% of the signal energy for a particular coupler geometry and length ($K_b$=0.13, L=1 cm). The relatively small attenuation in signal energy on bus 210 limits the impact of multiple devices 220 on the impedance of bus 210. One side effect of this limited signal attenuation is that the signal waveform on device side 242 of electromagnetic coupler 240 ("transferred waveform") is a small fraction of the energy transmitted on bus 210. Since the coupling coefficient is symmetric, a similar attenuation occurs in the reverse direction, from device side 242 to bus 210. The significance of this signal attenuation depends on the types of noise in system 200.

Scalable noise is noise that scales with the energy of the signal. Scalable noise associated with the transferred waveform is attenuated to the same extent as the transferred waveform itself. Sources of scalable noise include signal reflections that are not eliminated by electromagnetic coupler 240. Non-scalable noise includes externally coupled noise, thermal noise, and the like. Signal attenuation by electromagnetic coupler 240 may impact the performance of system 200 if non-scalable noise is not addressed. Strategies for addressing non-scalable noise in system 200 include selecting robust symbol modulation schemes and using differential signaling. For one embodiment of system 200, interface 230 amplifies the transferred waveform prior to demodulating it to recover the transmitted data.

Another side effect of electromagnetic coupler 240 is that the transferred waveform is altered relative to the signal on bus 210. In general, a signal transferred across electromagnetic coupler 240 is differentiated. For example, a positive signal pulse 260 on bus side 244 of electromagnetic coupler 240 becomes a positive/negative-going pulse 270 on device side 242 of electromagnetic coupler 240. The modulation scheme(s) employed in system 200 is selected to accommodate the amplitude attenuation and signal differentiation associated with electromagnetic couplers 240 without degrading the reliability of the communication channel. For example, signal attenuation, in the face of non-scaling noise sources, may limit the number of usable amplitude modulation voltage levels. Differentiation may require the use of integration circuits to recover DC voltages for level signaling, if that is desired instead of, or in addition to transition signaling. Also, the use of rise-time modulation (described below) in system 200 entails the measurement of the second derivative of a signal waveform.

For one embodiment of the invention, multi-drop bus system 200 is a computer system and devices 220 correspond to various system components, such as processors, memory modules, system logic and the like. An embodiment of the invention includes a 50 centimeter long bus 210 that supports up to 17 devices 220 capable of transferring data at a signal frequency of 400 MHz. By employing modulation schemes that provide a symbol density of 4 bits per symbol, this embodiment of system 200 provides a digital bandwidth of 1.6 gigabits per second per channel. Higher signal frequencies and higher symbol densities, enabled by the relatively clean noise environment of bus 210, may be employed to provide even greater digital bandwidth. For example, using appropriate materials, signaling frequencies on the order of 1 GHz may be employed in a multi-drop bus system.

Figure 11:
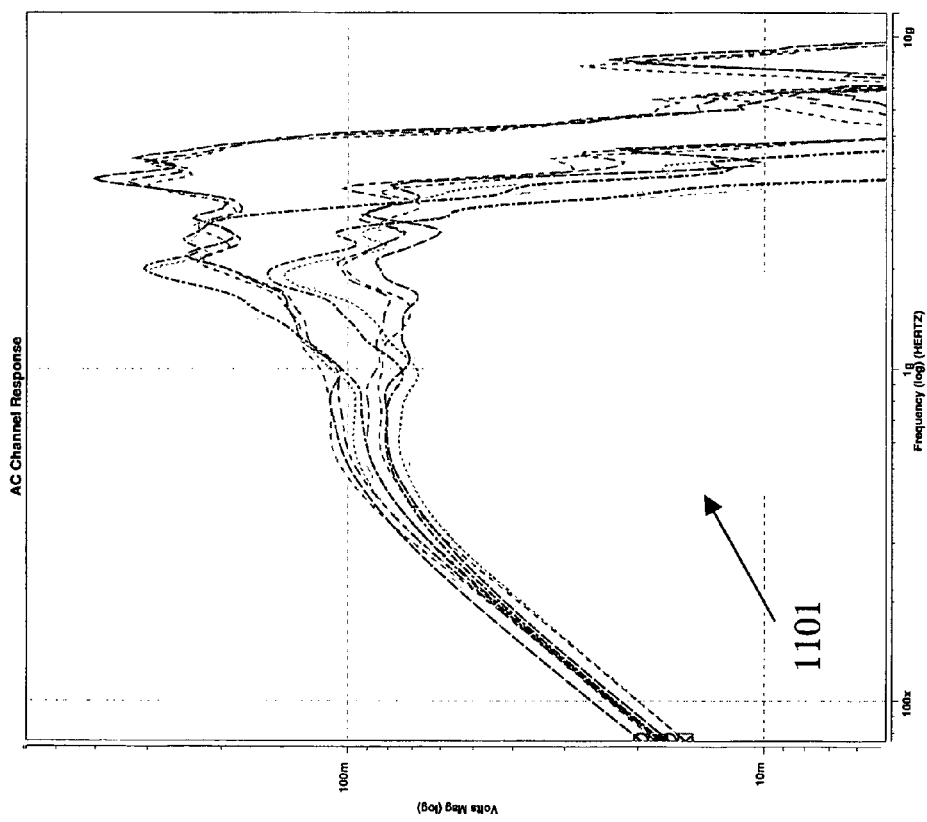
FIG. 11 is a frequency response plot of an embodiment of the communication channel of bus system 200.

FIG. 11 shows a family of curves that describe the bandwidth of electromagnetically coupled bus system 210 for the current state of the art in materials and electronic packages. The different curves represent different numbers of couplers and different coupling coefficients in a target range. The shape is a bandpass filter with passband labeled 1101. The lower frequency bound is set by the frequency response of coupler 240 and the upper bound is determined by printed circuit board material losses and package parasitic inductances and capacitances. Note that for a 1 cm. long coupler, the length-induced bandwidth limit occurs around 5 GHz, but it occurs at lower frequencies for longer couplers, e.g. 1.25 GHz for a 4 cm coupler length. Thus materials and parasitics limit the ability to scale symbol frequency $F_S$ higher. For example, the prevalent PC board dielectric material FR4 severely attenuates frequencies above 3 GHz. To increase digital bandwidth under these constraints, one is compelled to increase $N_S$ by using modulation techniques as described in the present invention. As material characteristics are improved, for example by replacing FR4 with Teflon, the present invention can be scaled in $F_S$, $N_S$, or some combination of the two to provide higher digital bandwidth as the passband 1101 of bus system 210 is widened.

One advantage of the electromagnetic coupling between devices 220 and bus 210 is that devices 220 may be added to and removed from system 200 more easily than in direct coupled systems or in electromagnetically coupled systems that require precise positioning of the coupler components. For example, use of electromagnetic couplers 240 eliminates the need to make or break electrical connections to, for example, the 32 traces of a 32-bit bus. Because of this, and benefits to electrostatic discharge protection, signal integrity, etc, the electromagnetic coupling aspect of this invention may have important advantages to applications such as hot-swapping.

For one embodiment of the present invention, electromagnetic couplers 240 have geometries that make their coupling coefficients less sensitive to the relative positioning of device side component 242 and bus side component 244. These geometries allow balanced couplers 240 to maintain their coupling coefficients in a selected range, despite variations in the horizontal or vertical separations of device and bus side components 242 and 244, respectively.

FIG. 3A represents one embodiment 300 of balanced electromagnetic coupler 240 having a geometry that provides relatively stable coupling between device 220 and bus 210. Coupler 300 is viewed looking in the negative z direction, relative to the coordinate system indicated in FIG. 2B (a portion of which is reproduced in FIG. 3A). For this orientation, a bus side component 320 appears above a device side component 330 of electromagnetic coupler 300. The geometries of bus and device side components 320, 330 allow the amount of energy transferred through coupler 300 to be relatively insensitive to the relative alignment of bus and device side components 320, 330.

For coupler 300, bus side component 320 undulates about a longitudinal direction defined by its end-points (along the y-axis) to form a zig-zag pattern. The disclosed embodiment of bus side component 320 includes four excursions from the longitudinal direction that alternate in the positive and negative x direction. The disclosed number, size, and angles of the excursions from the longitudinal direction are provided to illustrate the geometry generally. Their values may be varied to meet the constraints of a particular embodiment. Device side component 330 has a similar zig-zag pattern that is complementary to that of bus side component 320.

The repeated crossings form parallel plate regions 340(1)-340(4) (generically, "parallel plate regions 340") and fringe regions 350(1)-350(3) (generically, "fringe regions 350") for coupler 300. Parallel plate and fringe regions 340 and 350, respectively, provide different contributions to the coupling coefficient of coupler 300, which mitigate the effects of variations in the relative alignment of components 320 and 330. For example, the sizes of plate regions 340 do not vary significantly if components 320 and 330 are shifted slightly from their reference positions in the x, y plane, and the sizes of fringe regions 350 vary so that changes in adjacent regions approximately offset each other when components 320 and 330 are shifted from their reference positions in the x, y plane. For an embodiment of coupler 300 in which S is 0.125 cm, δ=35°, and W is 5 mils, $K_C$ varies by only ±2% as components 320 and 330 are shifted by ±8 mils in the x and/or y directions from their nominally aligned positions.

The effects of variations in the vertical separations between components 320 and 330 are also mitigated in coupler 300. Coupling in parallel plate regions 340 varies inversely with separation (z), while variations in fringe regions 350 vary more slowly with separation. The net effect is a reduced sensitivity to variations in z for coupler 300. With this choice of coupler geometry, a +/−30% change in coupler separation (z) results in the capacitive coupling coefficient varying by less than +/−15%. This compares favorably with parallel plate based coupler geometries, which show a +40/−30% variation over the same range of conductor separations.

For the disclosed embodiment of coupler 300, components 320 and 330 have rounded corners to provide a relatively uniform impedance environment for signals transmitted along either component. For similar reasons, components 320 and 330 have relatively uniform cross sections. In sum, coupler 300 provides robust signal transmission between device 220 and bus 210, without introducing significant impedance changes in either environment.

FIG. 3B represents another embodiment 304 of balanced electromagnetic coupler 240. For the disclosed embodiment, one component 324 retains the undulating or zig-zag geometry similar to that described above for component 320, while a second component 334 has a substantially straight geometry. Component 334 may form either the bus side or device side of coupler 304, while component 324 forms the opposite side. Coupler 304 includes both parallel plate regions 344 and fringe regions 354, although the latter is smaller than fringe region 350 in coupler 300. Consequently, coupler 304 may be more sensitive to variations in the relative positions of components 324 and 334 than coupler 300.

Figure 3C:
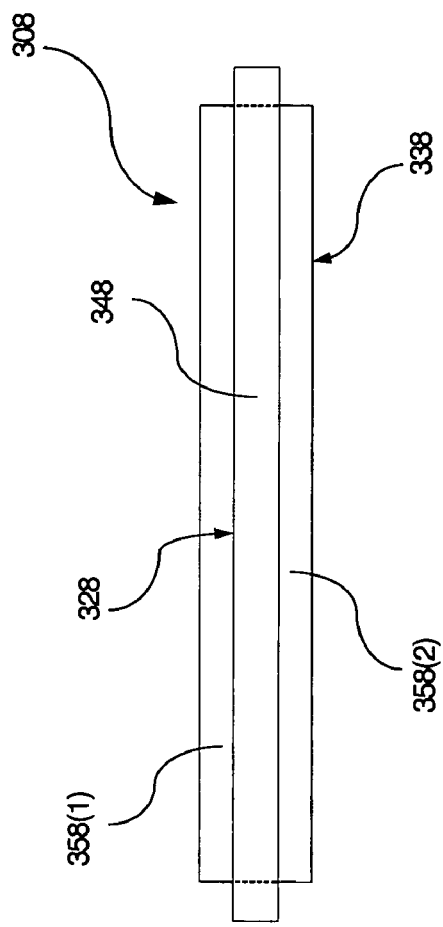

FIG. 3C represents yet another embodiment 308 of balanced electromagnetic coupler 240. For this embodiment, one component 328 is narrower than a second component 338 to provide both parallel plate region 348 and fringe regions 358.

Figure 3D:
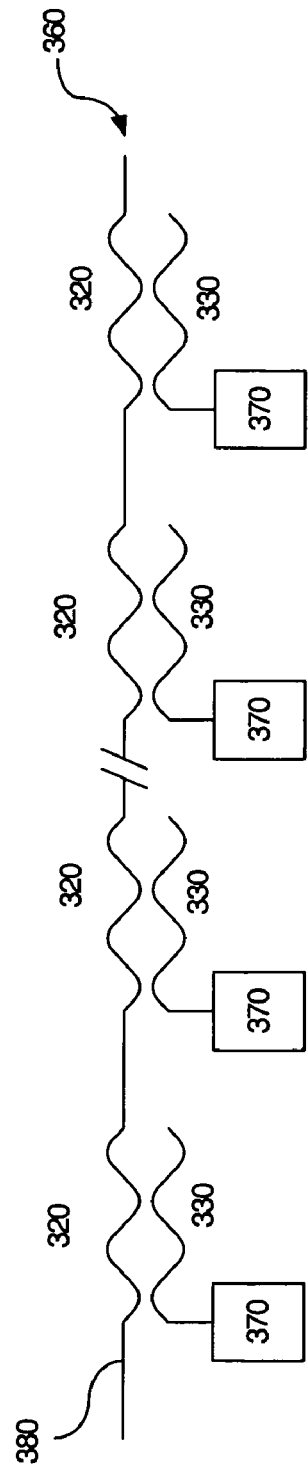

FIG. 3D illustrates a portion of a multi-drop bus system 360 that incorporates coupler 300. A bus trace 380 includes multiple bus side components 320 at spaced intervals along its length. Corresponding devices 370 are coupled to bus trace 380 through their associated device side components 330. Components 320, 330 are shown rotated to indicate their geometry. Embodiments of coupler 300 may include selected dielectric materials between components 320, 330 to facilitate positioning or adjust the coupling coefficient.

Figure 3E:
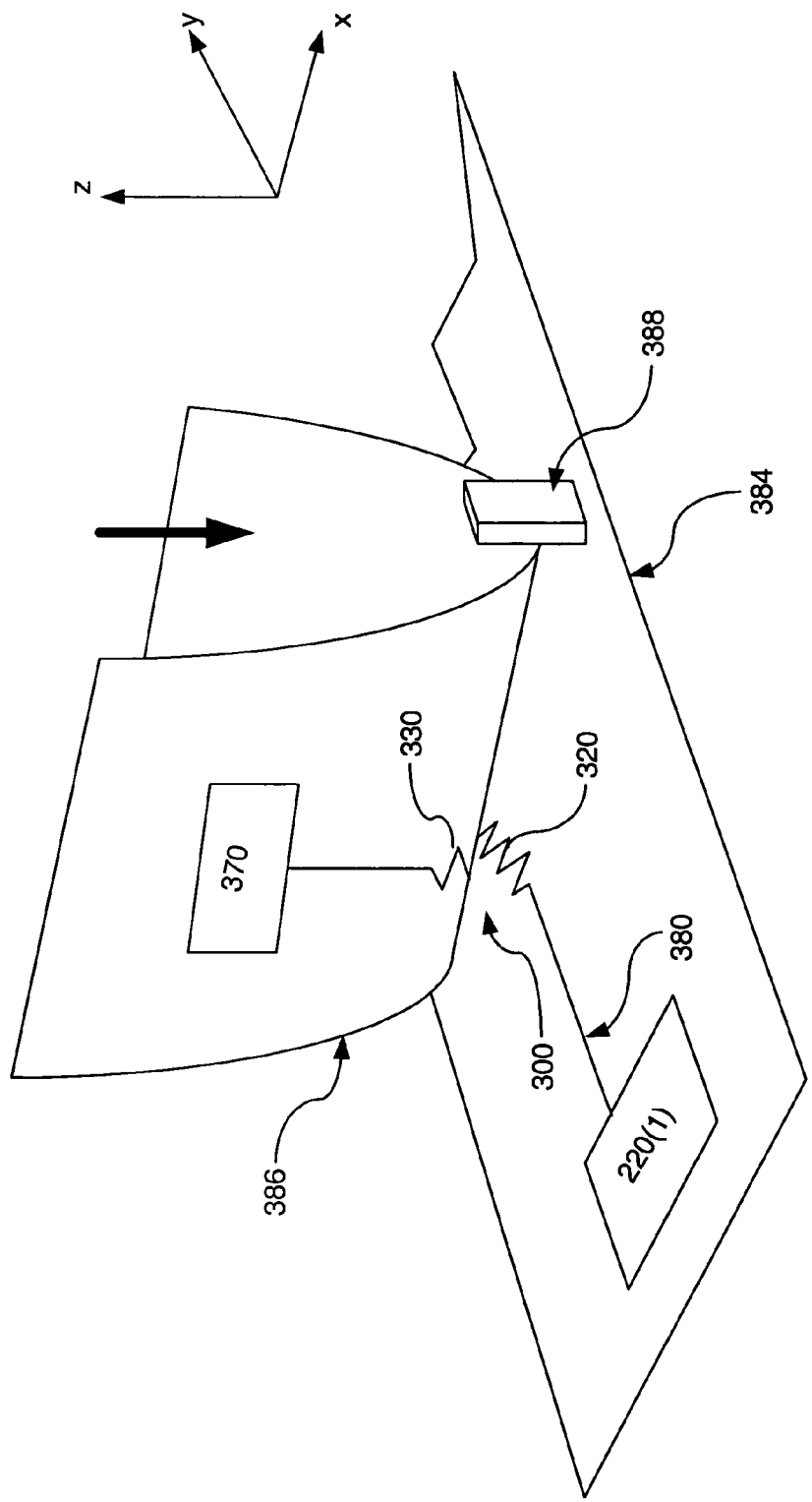

FIG. 3E illustrates one mechanism for coupling device 370 to bus trace 380. For the disclosed embodiment, bus trace 380, including bus side component 320 of coupler 300, is mounted on a circuit board 384. One end of bus trace 380 is connected to device 220(1). Device 370 is mounted on a flex circuit 386 and connected to device side component 330, only a portion of which is visible in FIG. 3E. Device side component 330 continues along a surface of flex circuit 386 that faces bus side component 320 when flex circuit 386 is pressed against circuit board 384 (as indicated by the arrow). A socket 388, only part of which is visible in FIG. 3E, is provided to hold flex circuit 386 in place.

The flexible character of flex circuit 386 allows it to bend as it is pressed against circuit board 384. For one embodiment, device side component 330 resides on a relatively flat portion of flex circuit 386 formed by pressing flex circuit 386 against circuit board 384. When fully inserted, looking down on coupler 300 along the negative z-axis, device side component 330 and bus side component 320 are aligned as in FIG. 3A. A spacer may be provided to maintain a separation between bus and device side components 320 and 330, respectively, or one or both of components 320 and 330 may be coated with a dielectric material, allowing them to be pressed together without creating a short circuit. A trace that couples device side component 330 to device 370 bends with flex circuit 386, eliminating the need for a connector between device side component 330 and device 370.

Flex circuit 386 may comprise, for example, one or more layers of a flexible and/or resilient material such as an epoxy dielectric material, a polyimide (e.g. Kapton® by E. I. du Pont de Nemours of Wilmington, Del.), or polyethylene terephthalate (PET). For one embodiment, device side component 330 may be sandwiched between layers of the flexible/resilient material, to provide the elasticity and dielectric isolation used to form coupler 300. The disclosed mechanism is just one of many ways that may be used to couple device 370 to bus trace 380. For example, various combinations of flexible and rigid materials, daughter cards and variations on these mechanisms may be employed.

The cleaner noise environment provided by a multi-drop bus system that is implemented in accordance with the present invention allows signals to be transmitted reliably at higher frequencies than in conventional multi-drop bus systems. However, gains in bandwidth provided by higher signaling frequencies alone are limited. For example, the scale of irregularities capable of scattering signals in the transmission channel decreases as the signal frequency increases. In addition, parasitic capacitances and inductances, which can not be completely eliminated or masked, reduce transmission speed, attenuate signal amplitudes, and create circuit resonances at high frequencies. Further, material properties such as skin effect and dielectric losses may limit high frequency propagation. The signal attenuation by electromagnetic coupler 240 may also affect bandwidth. For example, amplifying transmitted signals to offset attenuation may limit the frequency at which signals can be transmitted.

As noted above, the digital bandwidth of a channel is given by $BW = F_S N_S$, where $F_S$ is the symbol frequency and $N_S$ is the number of bits transmitted per symbol ("symbol density"). For one embodiment of the present invention, various modulation schemes are employed to increase $N_S$, for a specified symbol period ($1/F_S$). For a given $F_S$, the larger $N_S$ provides an overall increase in BW that avoids the limitations associated with reliance on high frequency signaling alone. Selected modulation schemes may be combined with high frequency signaling to provide significant increases in BW.

In the following discussion, various time-domain modulation schemes are used for purposes of illustration. The benefits of the present invention are not limited to the disclosed modulation schemes. Other time-domain modulation schemes, such as shape modulation (varying the number of edges in a pulse), narrowband and wideband frequency-domain modulation schemes, such as frequency modulation, phase modulation, and spread spectrum, or combinations of both time and frequency-domain modulation schemes (a pulse superposed with a high frequency sinusoid), are also suitable for use with this invention.

FIG. 4 is a schematic representation of a signal 410 that illustrates the interplay between $F_S$, $N_S$, and various modulation schemes that may be employed to encode multiple data bits into a symbol. Signal 410 includes a modulated symbol 420 transmitted in a symbol period ($F_S^{-1}$). For purposes of illustration, phase, pulse-width, rise-time, and amplitude modulation schemes are shown encoding five bits of data ($N_S = 5$) in symbol 420. The present invention may implement these modulation schemes as well as others, alone or in combination, to increase the bandwidth for a particular system. The modulation scheme(s) may be selected by considering the bit interval (see below), noise sources, and circuit limitations applicable to each modulation scheme under consideration, and the symbol period available for a given frequency.

In the following discussion, a "pulse" refers to a signal waveform having both a rising edge and a falling edge. For pulse-based signaling, information may be encoded, for example, in the edge positions, edge shapes (slopes), and signal amplitudes between edge pairs. The present invention is not limited to pulse-based signaling, however. Other signal waveforms, such as edge-based signaling and various types of amplitude, phase, or frequency-modulated periodic waveforms may be implemented as well. The following discussion focuses on modulation of pulse-based signaling schemes to elucidate various aspects of the present invention, but these schemes are not necessary to practice the invention. Considerations similar to those discussed below for pulse-based signaling may be applied to other signal waveforms to select an appropriate modulation scheme.

For signal 410, the value of a first bit (0 or 1) is indicated by where ($p_0$ or $p_1$) the leading edge of symbol 420 occurs in the symbol period (phase modulation or PM). The values of second and third bits are indicated by which of 4 possible widths ($w_0$, $w_1$, $w_2$, $w_3$) the pulse has (pulse-width modulation or PWM). The value of a fourth bit is indicated by whether the falling edge has a large ($rt_0$) or small ($rt_1$) slope (rise-time modulation or RTM), and the value of a fifth bit is indicated by whether the pulse amplitude is positive or negative ($a_0$, $a_1$) (amplitude modulation or AM). Bold lines indicate an actual state of symbol 420, and dashed lines indicate other available states for the described encoding schemes. A strobe is indicated within the symbol period to provide a reference time with which the positions of the rising and falling edges may be compared. The number of bits encoded by each of the above-described modulation schemes is provided solely for illustration. In addition, RTM may be applied to the rising and/or is falling edges of symbol 420, and AM may encode bits in the magnitude and/or sign of symbol 420.

PM, PWM, and RTM are examples of time-domain modulation schemes. Each time-domain modulation scheme encodes one or more bits in the time(s) at which one or more events, such as a rising edge or a rising edge followed by a falling edge, occur in the symbol period. That is, different bit states are represented by different event times or differences between event times in the symbol period. A bit interval associated with each time-domain modulation scheme represents a minimum amount of time necessary to reliably distinguish between the different bit states of the scheme. The modulation schemes selected for a particular system, and the number of bits represented by a selected modulation scheme is determined, in part, by the bit intervals of the candidate modulation schemes and the time available to accommodate them, i.e. the symbol period.

In FIG. 4, $t_1$ represents a minimum time required to distinguish between $p_0$ and $p_1$ for a phase modulation scheme. One bit interval of duration $t_1$ is allocated within the symbol period to allow the pulse edge to be reliably assigned to $p_0$ or $p_1$. The value of $t_1$ depends on noise and circuit limitations that can interfere with phase measurements. For example, if the strobe is provided by a clock pulse, clock jitter may make the strobe position (time) uncertain, which increases the minimum interval necessary to reliably distinguish between $p_0$ and $p_1$. Various circuit limitations and solutions are discussed below in greater detail.

Similarly, one bit interval of duration $t_3$ is allocated within the symbol period to allow the two states ($rt_0$, $rt_1$) to be distinguished reliably. The size of $t_3$ is determined by noise and circuit limitations associated with rise time measurements. For example, rise times are differentiated by passing through coupler 240. Consequently, $t_3$ must be long enough to allow the measurement of a second derivative.

Three bit intervals of duration $t_2$ are allocated within the symbol period to allow the four states ($w_0$, $w_1$, $w_2$, $W_3$) to be reliably distinguished. The size of $t_2$ is determined by noise and circuit limitations associated with pulse width measurements. If pulse width is determined relative to a clock strobe, considerations regarding clock jitter may apply. If pulse width is determined relative to, e.g., the leading edge of a pulse, considerations such as supply voltage variations between the measurements of the leading and trailing edges may apply.

In general, the time needed to encode an n-bit value in a time-domain modulation scheme (i) that has a bit interval, $t_i$, is $(2^n-1) \cdot t_i$. If non-uniform bit intervals are preferred for noise or circuit reasons, the total time allotted to a modulation scheme is the sum of all of its bit intervals. When multiple time-domain modulation schemes are employed, the symbol period should be long enough to accommodate $\Sigma (2^{n(i)}-1) \cdot t_i$, plus any additional timing margins. Here, the summation is over all time-domain modulation schemes used. In the above example, the symbol period should accommodate $t_1 + t_3 + 3 t_2$, plus any other margins or timings. These may include minimum pulse widths indicated by channel bandwidth, residual noise, and the like.

Using multiple encoding schemes reduces the constraints on the symbol time. For example, encoding 5 bits using pulse width modulation alone requires at least $31 \cdot t_2$. If $t_2$ is large enough, the use of the single encoding scheme might require a larger symbol period (lower symbol frequency) than would otherwise be necessary.

A minimum resolution time can also be associated with amplitude modulation. Unlike the time domain modulation schemes, amplitude modulation encodes data in pulse properties that are substantially orthogonal to edge positions. Consequently, it need not add directly to the total bit intervals accommodated by the symbol period. For example, amplitude modulation uses the sign or magnitude of a voltage level to encode data.

The different modulation schemes are not completely orthogonal, however. In the above example, two amplitude states (positive and negative) encode one bit, and the minimum time associated with this interval may be determined, for example, by the response time of a detector circuit to a voltage having amplitude, A. The pulse width should be at least long enough for the sign of A to be determined. Similarly, a symbol characterized by rise-time state $rt_1$ and width state $w_3$ may interfere with a next symbol characterized by phase state $p_0$. Thus, noise and circuit limitations (partly summarized in the bit intervals), the relative independence of modulation schemes, and various other factors are considered when selecting modulation schemes to be used with the present invention.

Figure 5B:
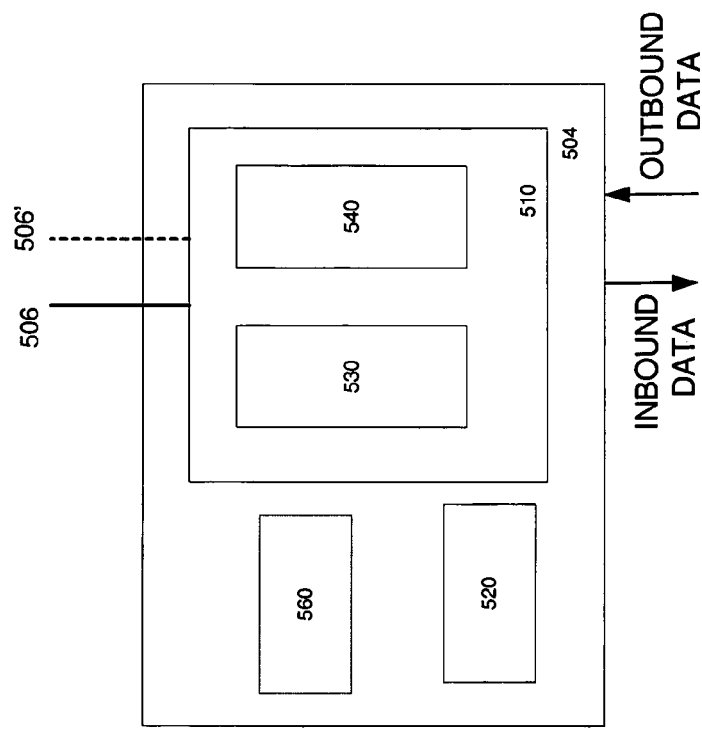
FIGS. 5A and 5B are block diagrams of embodiments of an interface that is suitable for use with the present invention.
Figure 5A:
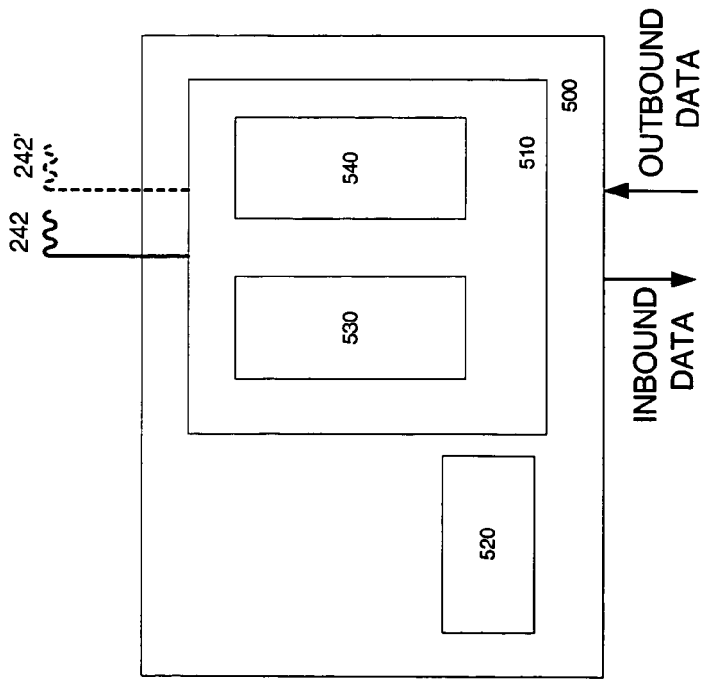

FIG. 5A is a block diagram of an embodiment 500 of interface 230 suitable for processing multi-bit symbols for devices 220(2)-220(m). For example, interface 500 may be used to encode outbound bits from, e.g., device 220(2) into a corresponding symbol for transmission on bus 210, and to decode a symbol received on bus 210 into inbound bits for use by device 220(2).

The disclosed embodiment of interface 230 includes a transceiver 510 and a calibration circuit 520. Also shown in FIG. 5A is device side component 242 of electromagnetic coupler 240 to provide a transferred waveform to transceiver 510. For example, the transferred waveform may be the differentiated waveform generated by transmitting pulse 420 across electromagnetic coupler 240. A device side component 242 is provided for each channel, e.g. bus trace, on which interface 230 communicates. A second device side component 242' is indicated for the case in which differential signaling is employed.

Transceiver 510 includes a receiver 530 and a transmitter 540. Receiver 530 recovers the bits encoded in the transferred waveform on device side component 242 of electromagnetic coupler 240 and provides the recovered bits to the device associated with interface 230. Embodiments of receiver 530 may include an amplifier to offset the attenuation of signal energy on transmission across electromagnetic coupler 240. Transmitter 540 encodes data bits provided by the associated device into a symbol and drives the symbol onto device side 242 of electromagnetic coupler 240.

Calibration circuit 520 manages various parameters that may impact the performance of transceiver 510. For one embodiment of interface 230, calibration circuit 520 may be used to adjust termination resistances, amplifier gains, or signal delays in transceiver 510, responsive to variations in process, temperature, voltage, and the like.

FIG. 5B is a block diagram of an embodiment 504 of interface 230 that is suitable for processing encoded symbols for a device that is directly connected to the communication channel. For example, in system 200 (FIG. 2), device 220(1) may represent the system logic or chipset of a computer system that is directly connected to a memory bus (210), and devices 220(2)-220(m) may represent memory modules for the computer system. Accordingly, a DC connection 506 is provided for each channel or trace on which interface 504 communicates. A second DC connection 506' (per channel) is indicated for the case in which differential signaling is employed. Interface 504 may include a clock synchronization circuit 560 to account for timing differences in signals forwarded from different devices 220(2)-220(m) and a local clock.

Figure 6:
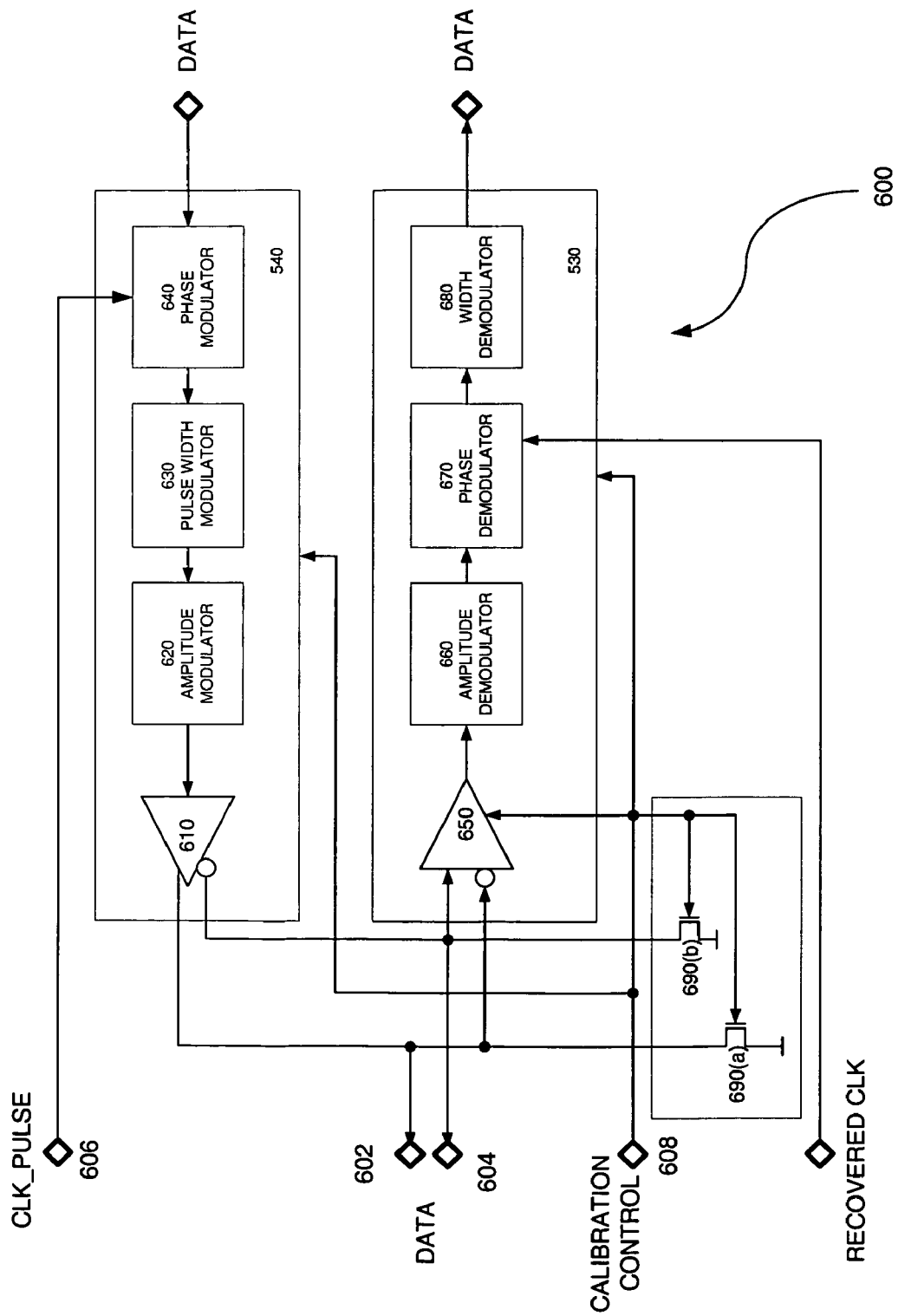
FIG. 6 is a block diagram of one embodiment of a transceiver module to encode and decode bits via amplitude, pulse-width, and phase modulation.

FIG. 6 is a block level diagram representing an embodiment 600 of transceiver 510 that is suitable for handling waveforms in which data bits are encoded using phase, pulse-width and amplitude modulation, and the strobe is provided by a clock signal. Transceiver 600 supports differential signaling, as indicated by data pads 602, 604, and it receives calibration control signals from, e.g., calibration circuit 520, via control signals 608.

For the disclosed embodiment of transceiver 510, transmitter 540 includes a phase modulator 640, a pulse-width modulator 630, an amplitude modulator 620 and an output buffer 610. Output buffer 610 provides inverted and non-inverted outputs to pads 602 and 604, respectively, to support differential signaling. A clock signal is provided to phase modulator 640 to synchronize transceiver 510 with a system clock. The disclosed configuration of modulators 620, 630, and 640 is provided only for purposes of illustration. The corresponding modulation schemes may be applied in a different order or two or more schemes may be applied in parallel.

The disclosed embodiment of receiver 530 includes an amplifier 650, an amplitude demodulator 660, a phase demodulator 670, and a pulse-width demodulator 680. The order of demodulators 660, 670, and 680 is provided for illustration and is not required to implement the present invention. For example, various demodulators may operate on a signal in parallel or in an order different from that indicated.

Devices 690(a) and 690(b) (generically, "device 690") act as on-chip termination impedances, which in one embodiment of this invention are active while interface 230 is receiving. The effectiveness of device 690 in the face of, e.g., process, temperature, and voltage variations may be aided by calibration circuit 520. For transceiver 600, device 690 is shown as an N device, but the desired functionality may be provided by multiple N and/or P devices in series or in parallel. The control provided by calibration circuit 520 may be in digital or analog form, and may be conditioned with an output enable.

Figure 7A:
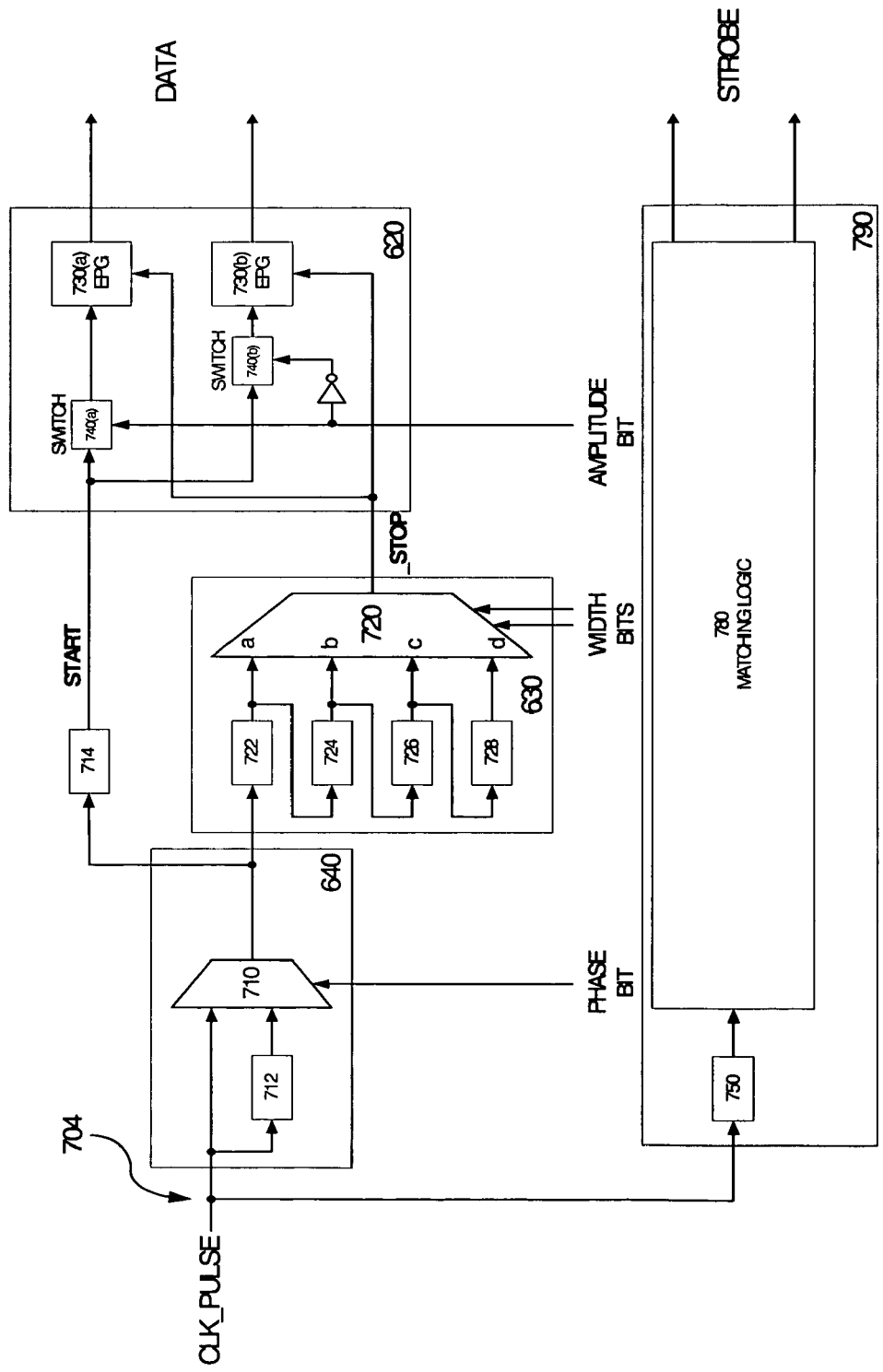
FIGS. 7A-7D are circuit diagrams for various components of one embodiment of the transmitter of FIG. 6.

FIG. 7A is a circuit diagram of one embodiment of transmitter 540 and its component modulators 620, 630, 640. Also shown is a strobe transmitter 790 suitable for generating a strobe signal, which may be transmitted via bus 210. For one embodiment of system 200, two separate strobes are provided. One strobe is provided for communications from device 220(1) to devices 220(2) through 220(m), and another strobe is provided for communications from devices 220(2) through 220(m) back to device 220(1).

The disclosed embodiment of transmitter 540 modulates a clock signal (CLK_PULSE) to encode four outbound bits per symbol period. One bit is encoded in the symbol's phase (phase bit), two bits are encoded in the symbol's width (width bits) and one bit is encoded in the symbol's amplitude (amplitude bit). Transmitter 540 may be used to generate a differential symbol pulse per symbol period, and strobe transmitter 790 may be used to generate a differential clock pulse per symbol period.

Phase modulator 640 includes a MUX 710 and delay module (DM) 712. MUX 710 receives a delayed version of CLK_PULSE via DM 712 and an undelayed version of CLK_PULSE from input 704. The control input of MUX 710 transmits a delayed or undelayed first edge of CLK_PULSE responsive to the value of the phase bit. In general, a phase modulator 640 that encodes p-phase bits may select one of $2^P$ versions of CLK_PULSE subject to different delays. For the disclosed embodiment, the output of phase modulator 640 indicates the leading edge of symbol 420 and serves as a timing reference for generation of the trailing edge by width modulator 630. A delay-matching block (DMB) 714 is provided to offset circuit delays in width modulator 630 (such as the delay of MUX 720) which might detrimentally impact the width of symbol 420. The output of DMB 714 is a start signal (START), which is provided to amplitude modulator 620 for additional processing.

Width modulator 630 includes DMs 722, 724, 726, 728, and MUX 720 to generate a second edge that is delayed relative to the first edge by an amount indicated by the width bits. The delayed second edge forms a stop signal (_STOP) that is input to amplitude modulator 620 for additional processing. For the disclosed embodiment of transmitter 540, two bits applied to the control input of MUX 720 select one of four different delays for the second edge, which is provided at the output of MUX 720. Inputs a, b, c, and d of MUX 720 sample the input signal, i.e. the first edge, following its passage through DMs 722, 724, 726, and 728, respectively. If the width bits indicate input c, for example, the second edge output by MUX 720 is delayed by DM 722+DM 724+DM 726 relative to the first edge.

Amplitude modulator 620 uses START and _STOP to generate a symbol pulse having a first edge, a width, and a polarity indicated by the phase, width, and amplitude bits, respectively, provided to transmitter 540 for a given symbol period. Amplitude modulator 620 includes switches 740(a) and 740(b) which route START to edge-to-pulse generators (EPG) 730(a) and 730(b), respectively, depending on the state of the amplitude bit. Switches 740 may be AND gates, for example. _STOP is provided to second inputs of EPGs 730(a) and 730(b) (generically, EPG 730). On receipt of START, EPG 730 initiates a symbol pulse, which it terminates on receipt of _STOP. Depending on which EPG 730 is activated, a positive or a negative going pulse is provided to the output of transmitter 540 via differential output buffer 610.

Strobe transmitter 790 includes DM 750 and matching logic block 780. DM 750 delays CLK_PULSE to provide a strobe signal that is suitable for resolving the data phase choices p0 and p1 of symbol 420. For one embodiment of strobe transmitter 790, DM 750 positions the strobe evenly between the phase bit states represented by p0 and p1 (FIG. 4). The strobe is used by, e.g., receiver 530 to demodulate phase by determining if the leading edge of data arrives before or after the strobe. DM 750 of strobe transmitter 790 thus corresponds to phase modulator 640 of data transmitter 540. Matching logic block 780 duplicates the remaining circuits of transmitter 540 to keep the timing of the strobe consistent with the data, after DM 750 has fixed the relative positioning.

In general, DM 750 and matching logic block 780 duplicate for the strobe the operations of transmitter 540 on data signals at the level of physical layout. Consequently, this delay matching is robust to variations in process, temperature, voltage, etc. In addition, the remainder of the communication channel from the output of transmitter 540, through board traces, electromagnetic coupler 240, board traces on the other side of coupler 240, and to the inputs of receiver 530 at the receiving device, may be matched in delays between data and strobe in order to keep the chosen relative timing. However, the matching of delays is one embodiment described for illustrative purposes and is not necessary to practice this invention. For example, if the circuits and remainder of the channel do not maintain matched data to strobe delays, receivers may calibrate for the relative timing of the strobe or even compensate for the absence of a strobe by recovering the timing from appropriately encoded data.

Figure 7C:
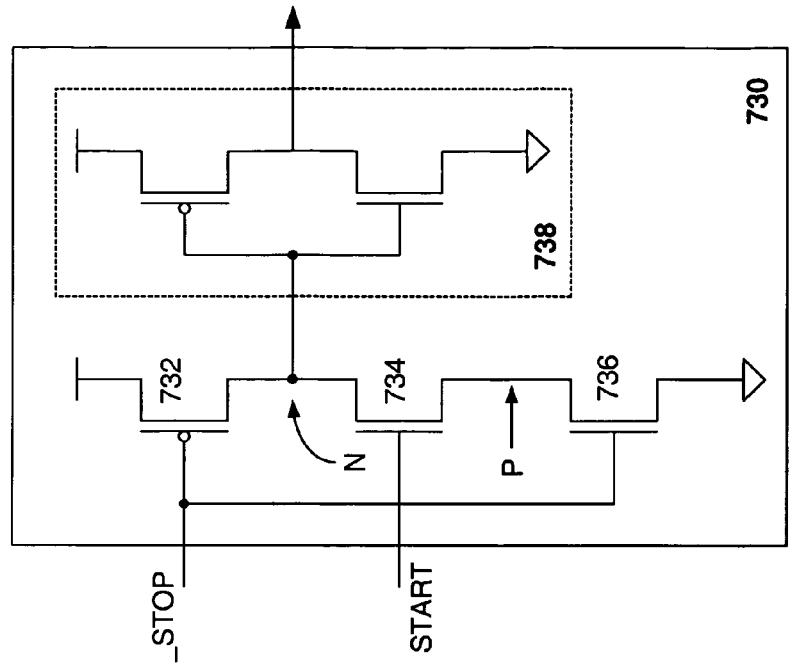
Figure 7B:
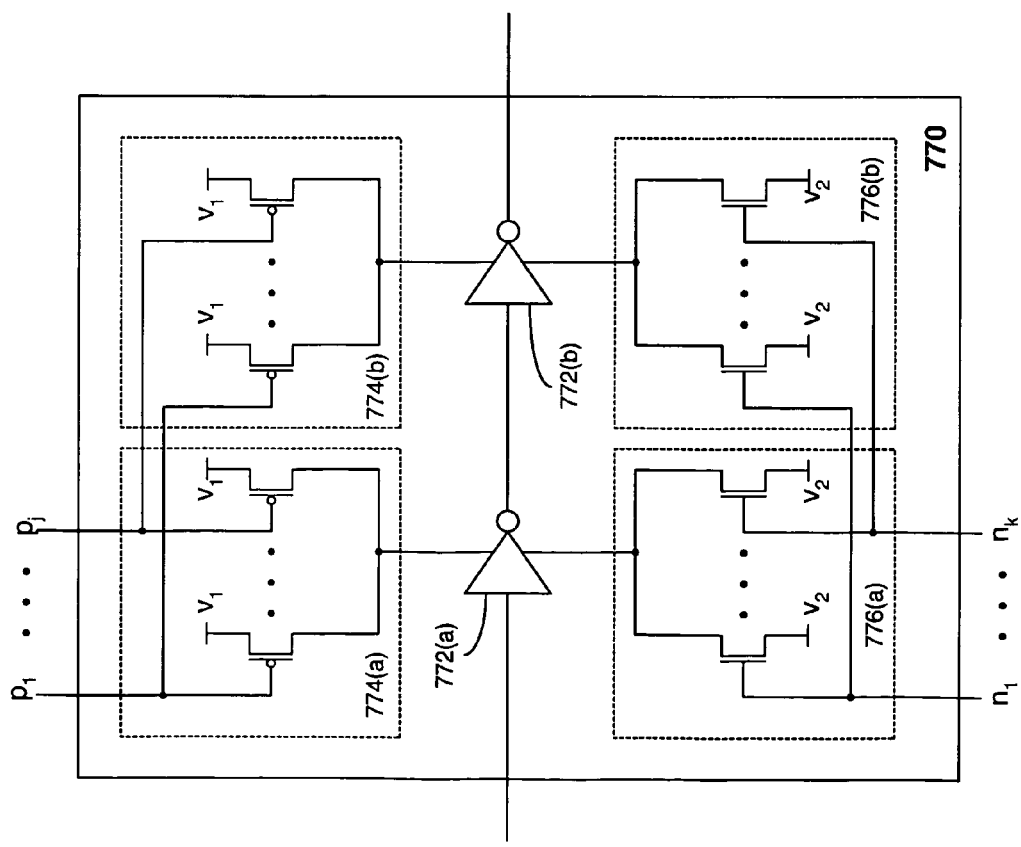

FIG. 7B is a schematic diagram of one embodiment of a programmable delay module (DM) 770 that is suitable for use with the present invention. For example, one or more DMs 770 may be used for any of DMs 712, 722, 724, 726, 728, and 750 in the disclosed embodiment of transmitter 540 to introduce programmable delays in START and _STOP. DM 770 includes inverters 772(*a*) and 772(*b*) that are coupled to reference voltages $V_1$ and $V_2$ through first and second transistor sets 774(*a*), 774(*b*) and 776(*a*), 776(*b*), respectively. Reference voltages $V_1$ and $V_2$ may be the digital supply voltages in some embodiments. Programming signals, $p_i$-$p_j$ and $n_1$-$n_k$, applied to transistor sets 774(*a*), 774(*b*) and 776(*a*), 776(*b*), respectively, alter the conductances seen by inverters 772(*a*) and 722(*b*) and, consequently, their speeds. As discussed below in greater detail, calibration circuit 520 may be used to select programming signals, $p_1$-$p_j$ and $n_1$-$n_k$, for inverters 772(*a*) and 772(*b*).

FIG. 7C is a schematic diagram of one embodiment of EPG 730 that is suitable for use with the present invention. The disclosed embodiment of EPG 730 includes transistors 732, 734, and 736 and inverter 738. The gate of N-type transistor 734 is driven by START. A positive-going edge on START indicates the beginning of a symbol pulse. The gates of P and N-type transistors 732 and 736, respectively, are driven by _STOP, which, for EPG 730(*a*) and 730(*b*) in FIG. 7A, is a delayed, inverted copy of START. A negative-going edge on _STOP indicates the end of a symbol pulse. When_STOP is high, transistor 732 is off and transistor 736 is on. A positive-going edge on START turns on transistor 734, pulling node N low and generating a leading edge for a symbol pulse at the output of EPG 730. A subsequent negative-going edge on _STOP, turns off transistor 736 and turns on transistor 732, pulling node N high and terminating the symbol pulse.

For a given symbol pulse, START may be deasserted (negative-going edge) before or after the corresponding _STOP is asserted. For example, the disclosed embodiment of transmitter 540 is timed with CLK_PULSE, and higher symbol densities may be obtained by employing narrow CLK_PULSEs. The widths of START and _STOP are thus a function of the CLK_PULSE width, while the separation between START and_STOP is a function of the width bits. The different possible relative arrivals of the end of START and beginning of _STOP may adversely impact the modulation of symbol 420 by the width bits. Specifically, transistor 734 may be on or off when a negative-going edge of _STOP terminates the symbol pulse. Node N may thus either be exposed to the parasitic capacitances at node P through transistor 734, or not. This variability may affect the delay of the trailing symbol edge through EPG 730 in an unintended way.

Figure 7D:
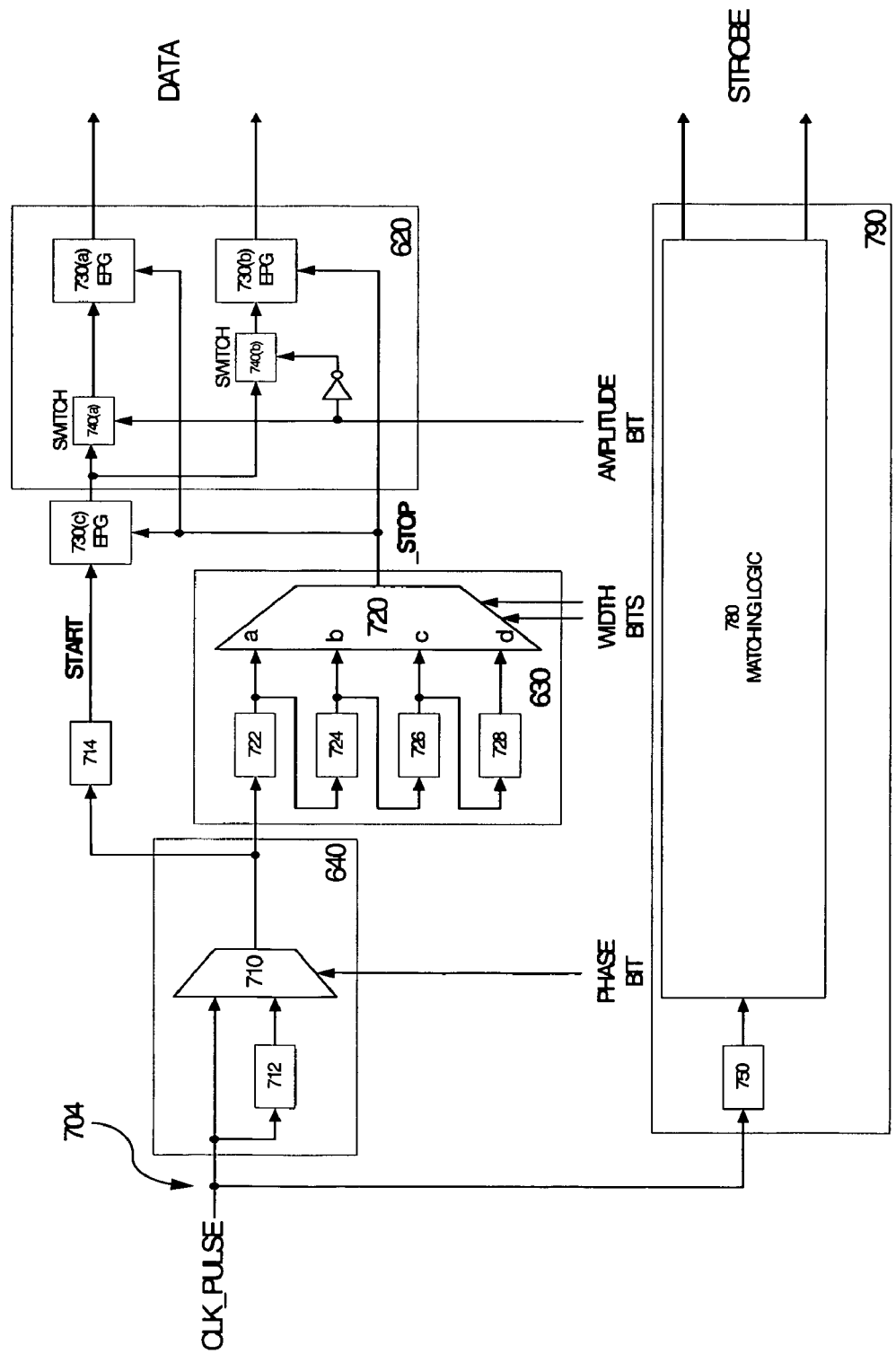

FIG. 7D is a schematic diagram of an alternative embodiment of transmitter 540 that includes an additional EPG 730 (*c*). EPG 730(*c*) reshapes START to ensure a consistent timing which avoids the variability described above. Namely, the modified START is widened so that it always ends after _STOP begins. This is done by generating a new START whose beginning is indicated by the original START but whose end is indicated by the beginning of _STOP, instead of the width of CLK_PULSE. Note also that, in the alternative embodiment shown in FIG. 7D, the sum of the delays through delay matching block 714 and EPG 730(*c*) must match the unintended delays in width modulator 630.

FIG. 8A-8E show CLK_PULSE, START, STOP, SYMBOL, and TR_SYMBOL, respectively, for one embodiment of system 200. Here, TR_SYMBOL represents the form of SYMBOL following transmission across electromagnetic coupler 240. The smaller amplitude of TR_SYMBOL relative to SYMBOL is roughly indicated by the scale change between the waveforms of FIG. 8D and 8E. TR_SYMBOL represents the signal that is decoded by interface 230 to extract data bits for further processing by device 220. The 4 outbound bits encoded by each SYMBOL are indicated below the corresponding SYMBOL in the order ($p, w_1, w_2, a$).

Figure 9A:
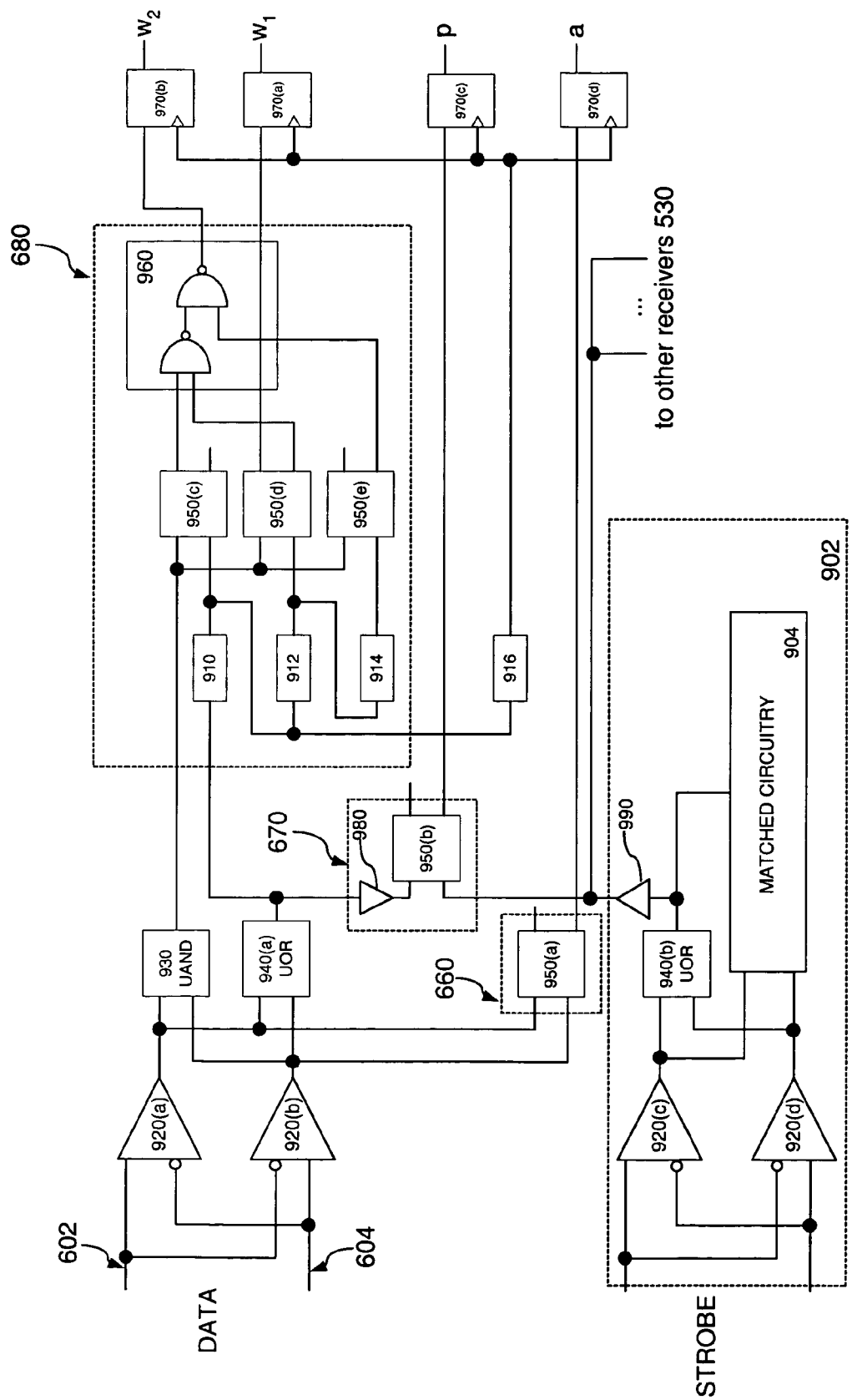
FIGS. 9A-9E are circuit diagrams for various components of one embodiment of a receiver that is suitable for use with the present invention.

FIG. 9A is a schematic diagram representing one embodiment of receiver 530 that is suitable for use with the present invention. The disclosed embodiment of receiver 530 processes differential data signals. FIG. 9A also shows a strobe receiver 902, which is suitable for processing a differential strobe signal. Strobe receiver 902 may provide delay matching for receiver 530 similar to that discussed above. Receiver 530 and strobe receiver 902 may be used, for example, in system 200 in conjunction with the embodiments of transmitter 540 and strobe transmitter 790 discussed above.

The disclosed embodiment of receiver 530 includes differential to single-ended amplifiers 920(*a*) and 920(*b*) which compensate for the energy attenuation associated with electromagnetic coupler 240. Amplifiers 920(*a*) and 920(*b*) produce digital pulses in response to either positive or negative pulses on the transferred signal (TR_SYMBOL in FIG. 8E) and its complement, e.g. the signals at inputs 602 and 604. In addition to amplification, amplifiers 920 may latch their outputs with appropriate timing signals to provide sufficient pulse widths for succeeding digital circuits.

Matching strobe receiver 902 similarly amplifies the accompanying differential strobe signal. For the disclosed embodiment, the received strobe is used to decode phase information in data symbol 420. Strobe receiver 902 includes differential to single-ended amplifiers 920(*c*) and 920(*d*) and matched circuitry 904. Matched circuitry 904 replicates much of the remaining circuitry in receiver 530 to match delays for data and strobe signals, similar to the matching of transmitter 540 and strobe transmitter 790. One embodiment of strobe receiver 902 includes circuits that correspond to phase demodulator 670 and width demodulator 680 with some minor modifications. For example, strobe buffer 990 buffers the received strobe for distribution to multiple receivers 530, up to the number of channels in, e.g., bus 210. Strobe buffer 990 may be large, depending on the number of receivers it drives. Data buffer 980 corresponds to strobe buffer 990. To save area, data buffer 980 need not be an exact replica of strobe buffer 990. The delays can also be matched by scaling down both data buffer 980 and its loading proportionately, relative to their counterparts in strobe receiver 902.

Figure 9C:
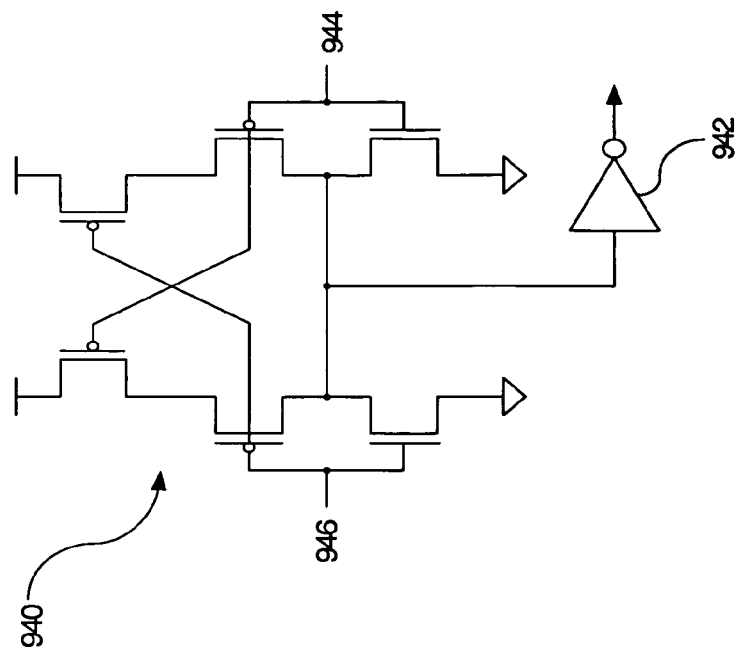
Figure 9B:
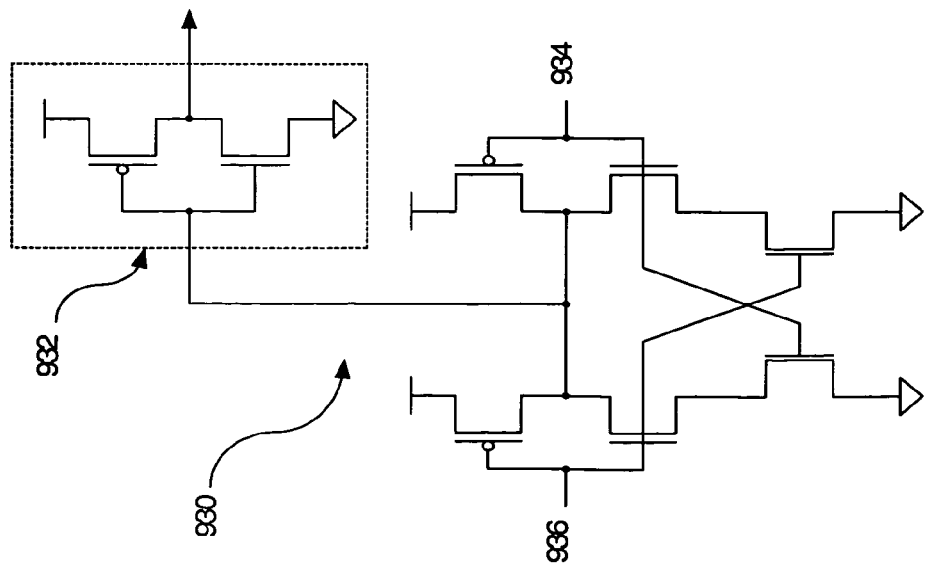

Uni-OR gate (UOR) 940(*a*) combines the outputs of amplifiers 920(*a*) and 920(*b*) to recover the first edge of TR_SYMBOL. The name uni-OR indicates that the propagation delay through gate 940 is uniform with respect to the two inputs. An embodiment of UOR 940 is shown in FIG. 9C. Similarly, uni-AND gate (UAND) 930 recovers the second edge of TR_SYMBOL. An embodiment of UAND 930 is shown in FIG. 9B.

Figure 9D:
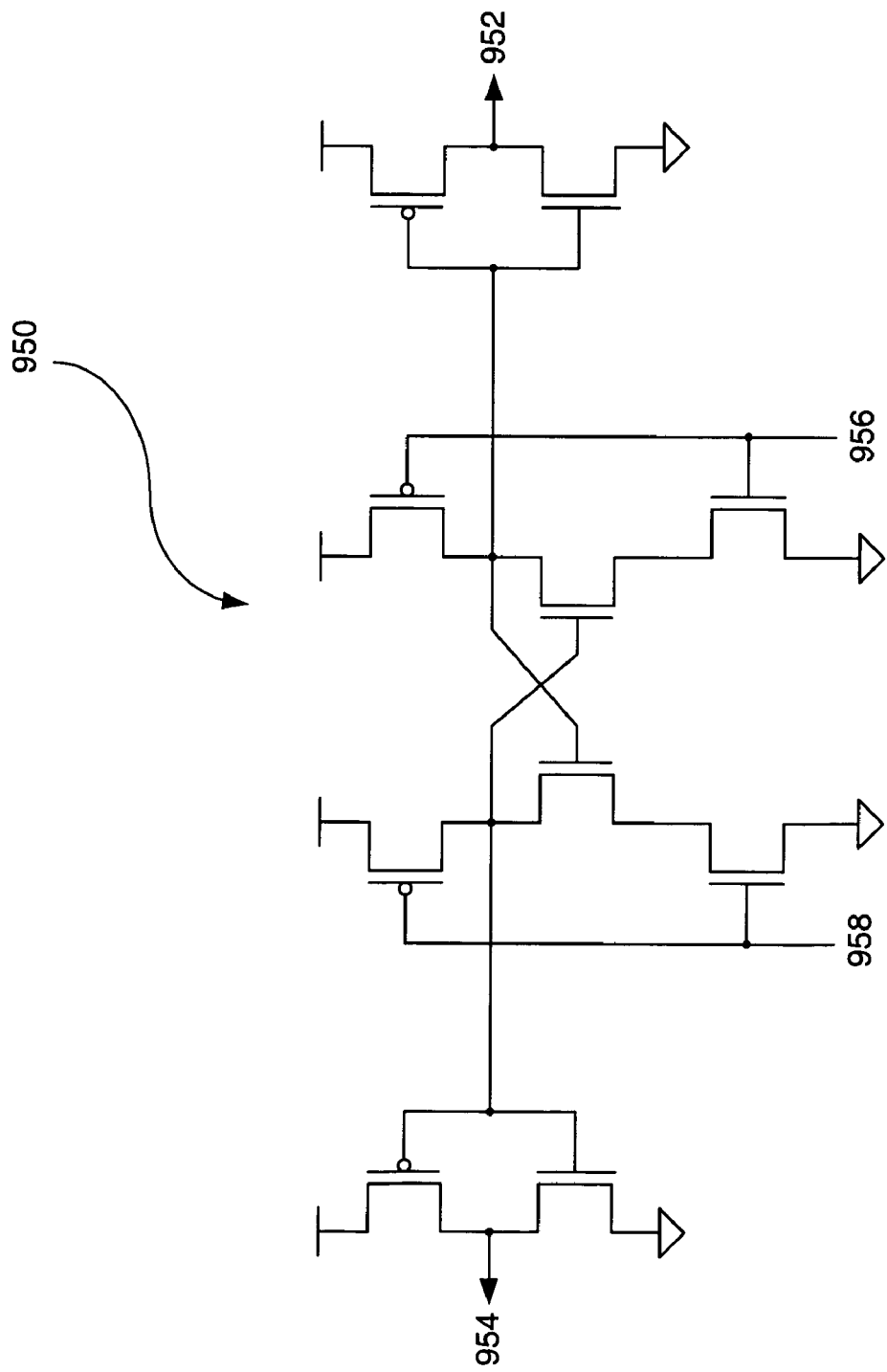

The disclosed embodiment of phase demodulator 670 includes an arbiter 950(*b*) (generically, "arbiter 950") and data buffer 980. Arbiter 950(b) compares the first edge recovered from the transferred symbol by UOR 940(a) with the corresponding edge from the recovered strobe by UOR 940(b), respectively, and sets a phase bit according to whether the recovered first edge of the symbol leads or follows the first edge of the strobe. An embodiment of arbiter 950 is shown in FIG. 9D. An output 952 goes high if input 956 goes high before input 958. Output 954 goes high if input 958 goes high before input 956.

Figure 9E:
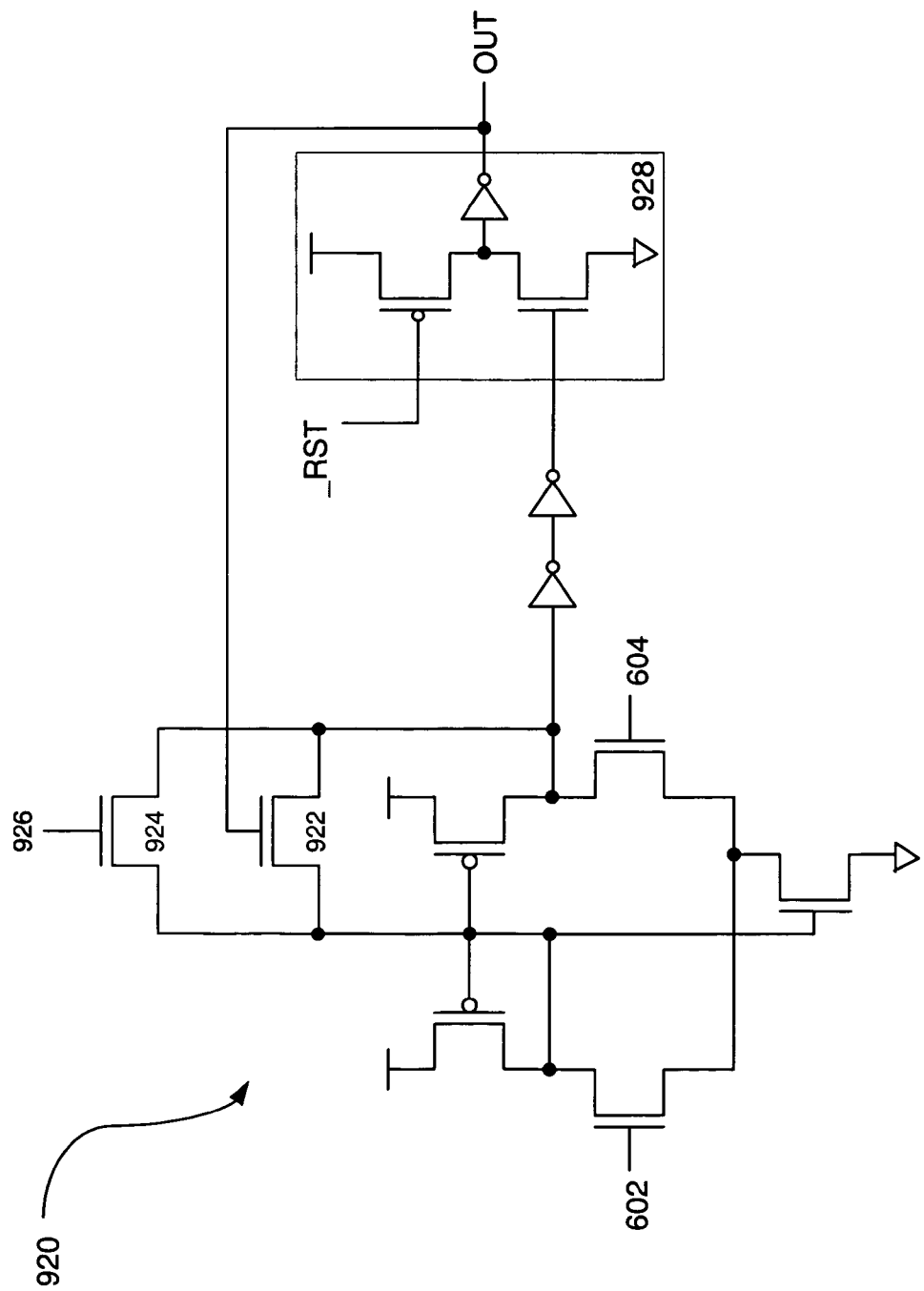

FIG. 9E is a circuit diagram representing one embodiment of amplifier 920. The disclosed embodiment of amplifier 920 includes a reset equalization device 922, a gain control device 924, and a pre-charged latch 928. Reset device 922 speeds up the resetting of amplifier 920 after a detected pulse, in preparation for the next symbol period. Gain control device 924 compensates the gain of amplifier 920 for variations in process, voltage, temperature, and the like. A control signal 926 may be provided by calibration circuit 520. More generally, device 924 may be multiple devices connected in series or parallel, and signal 926 may be several bits produced by calibration circuit 520. Pre-charged latch 928 reshapes received pulses for the convenience of succeeding circuits. Resulting output pulse widths are determined by a timing signal, _RST. For one embodiment of amplifier 920, _RST is produced by DM 916 (FIG. 9A), along with other timing signals used in receiver 530. It is possible for pre-charged latch 928 and signal _RST to be in inconsistent states, due to power-on sequences or noise. Additional circuitry may be used to detect and correct such events.

The disclosed embodiment of amplitude demodulator 660 includes an arbiter 950(a) which receives the amplified transferred signals from amplifiers 920(a) and 920(b). Arbiter 950(a) sets an amplitude bit according to whether the output of amplifier 920(a) or 920(b) pulses first.

The disclosed embodiment of width demodulator 680 includes delay modules (DMs) 910, 912, 914, arbiters 950(c), 950(d), 950(e), and decoding logic 960. The recovered first symbol edge is sent through DMs 910, 912, and 914 to generate a series of edge signals having delays that replicate the delays associated with different symbol widths. For one embodiment of the invention, DMs 910, 912, and 914 may be implemented as programmable delay modules (FIG. 7B). Arbiters 950(c), 950(d), and 950(e) determine the (temporal) position of the second edge with respect to the generated edge signals. Decoding logic 960 maps this position to a pair of width bits.

Latches 970(a), 970(b), 970(c), and 970(d) receive first and second width bits, the phase bit, and the amplitude bit, respectively, at their inputs, and transfer the extracted (inbound) bits to their outputs when clocked by a clocking signal. For the disclosed embodiment of receiver 530, the latches are clocked by sampling a signal from the delay chain of width demodulator 680 through the extra delay of DM 916. This latching synchronizes the demodulated bits to the accompanying strobe timing. In addition, a device 220 may require a further synchronization of the data to a local clock, e.g. clock synchronization circuit 560 in FIG. 5B. Persons skilled in the art and having the benefit of this disclosure will appreciate that this can be done in any number of different ways.

The various components in an embodiment of interface 230 include a number of circuit elements that may be adjusted to compensate for process, voltage, temperature variations and the like. For example, compensation may entail adjusting the delay provided by a programmable delay module (DM 770), the gain provided by an amplifier (amplifier 920), or the termination resistance (device sets 690(a) and 690(b)).

Figure 10:
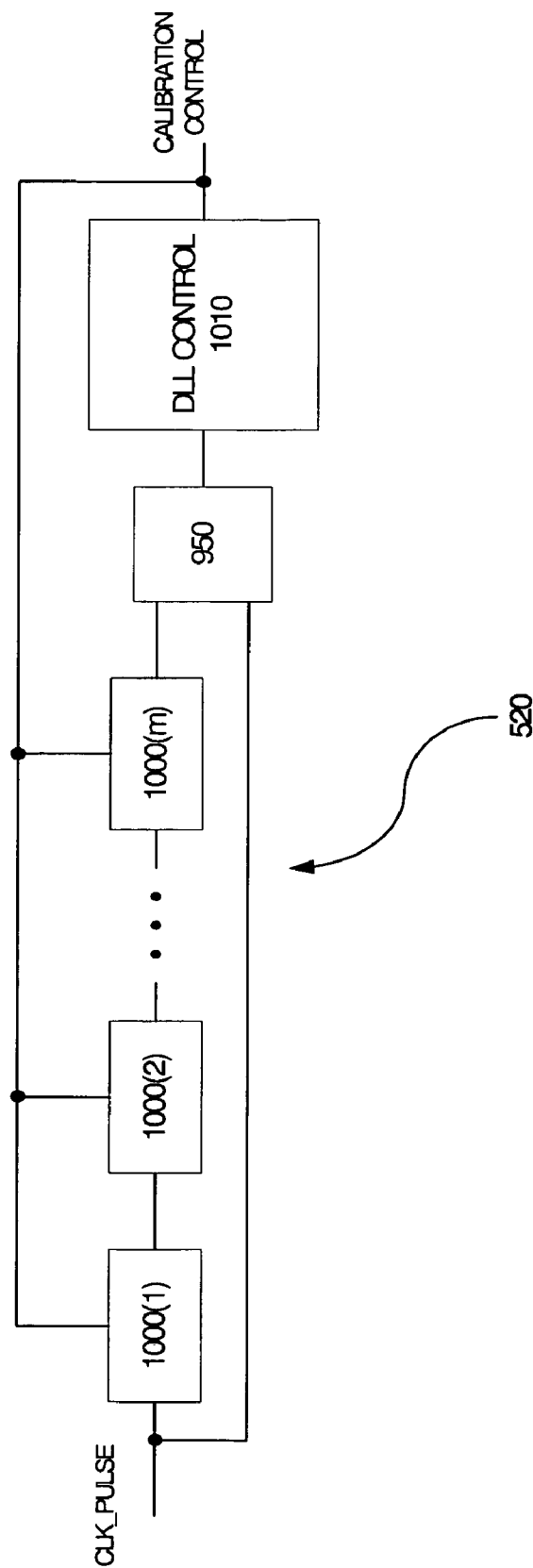
FIG. 10 is a block diagram representing a calibration circuit that is suitable for use with the present invention.

FIG. 10 shows an embodiment of calibration circuit 520. The purpose of calibration is to use feedback to measure and compensate for variable process, temperature, voltage, and the like. The embodiment of calibration circuit 520 shown in FIG. 10 is a delay-locked loop (DLL). A clock signal (CLK_PULSE) is delayed by series-connected DMs 1000(1)-1000(m). The number of DMs is chosen so that the sum of the delays can be set to match one period of CLK_PULSE. Arbiter 950 is used to detect when the sum of the delays through DMs 1000 is less than, equal to, or more than one clock period. DLL control 1010 cycles through delay control settings until the sum of the delays matches one clock period. The established control setting reflects the effects of process, temperature, voltage, etc . . . on the delays of DMs 1000. Calibration circuit 520 may be operated continuously, periodically, when conditions (temperature, voltage, etc. ) change, or according to any of a variety of other strategies.

The same calibration control settings can be distributed to DMs used throughout interface 230, such as DM 712, DM 910, etc. The desired delays of DMs in interface 230 are achieved by selecting a number of programmable delay modules 770 for each such DM which have the same ratio to the total number of delay modules 770 included in all the DMs 1000 as the ratio of the desired delay to the clock period. For example, if there are 20 total delay modules 770 in the sum of DMs 1000, one can select a delay of one tenth of the clock period by using 2 delay modules 770 for any particular DM used in interface 230. In addition, one can also choose a fractional extra delay for any particular DM by inserting small extra loads at the outputs of selected delay modules 770 which constitute that DM.

The calibration information obtained by calibration circuit 520 may also be used to control other circuit parameters, in the face of variable conditions. These may include the resistance of termination device 690 and gain of amplifier 920. This may be done by correlating the information contained in the delay control setting with the effects of like process, temperature, voltage, and like conditions on the other circuit parameters.

There has thus been disclosed a mechanism for providing high bandwidth communications in multi-drop bus systems. The disclosed system employs electromagnetic couplers to transfer data to and from a multi-drop bus. The electromagnetic couplers impose relatively minor perturbations on the electrical properties of the bus, reducing the noise associated with high frequency, transmission line effects. The cleaner noise environment allows various modulation schemes to be implemented in multi-drop bus systems at higher signaling frequencies.

The disclosed embodiments have been provided to illustrate various features of the present invention. Persons skilled in the art of bus-based system design, having the benefit of this disclosure, will recognize variations and modifications of the disclosed embodiments, which none the less fall within the spirit and scope of the appended claims.

We claim:

1. An apparatus comprising:
a transmitter to encode plural bits into selected properties of a symbol;
a trace including an electromagnetic coupling element having a shape, size, and distance from a bus to enable a substantially reliable signal transfer between the electromagnetic coupling element and the bus without significantly changing the impedance of the bus;
a receiver to detect a transferred symbol induced on the electromagnetic coupling element and to decode plural bits represented by the transferred symbol; and a termination device that is responsive to a calibration signal received by the apparatus.

2. An apparatus comprising:
a flexible material;
an electronic device; and
a conductor mounted on the flexible material and coupled to. the electronic device, the conductor including a coupling element having a shape, size, and distance from a bus to transfer symbols electromagnetically to and from the electronic device without significantly changing the impedance of the bus.

3. The apparatus of claim 2, wherein the electronic device comprises:
a memory structure to store digital data; and
an interface to translate between the digital data and the symbols.

4. The apparatus of claim 3, wherein the digital data includes plural bits and the interface comprises a transmitter to translate the plural bits into a symbol for transmission through the coupling element.

5. The apparatus of claim 4, wherein the flexible material is flexed to provide a curved portion and the coupling element interface is positioned on the curved portion.

6. The apparatus of claim 5, wherein the curved portion of the flexible material acquires a substantially planar geometry at the position of the coupling element, if the apparatus is pressed against a substantially planar surface.

7. The apparatus of claim 6, further comprising a mechanism to hold the apparatus against the substantially planar surface.

8. The apparatus of claim 2, wherein the coupling element has a zig-zag geometry.

9. A memory module comprising:
a memory device to store a plurality of bits;
a transmitter to encode the plurality of bits into a symbol;
a coupling element to electromagnetically transfer of a portion of energy associated with the symbol to a bus without significantly changing the impedance of the bus; and
a clamp to secure the memory module to a system to which the portion of the symbol energy to be transferred.

10. The memory module of claim 9, further comprising a receiver to decode plural bits from symbol energy received through the coupling element and to provide the decoded plural bits to the memory device for storage.

11. The memory module of claim 10, wherein the transmitter and the receiver form an interface to transfer data to and, from the memory device using two or more of pulse-width modulation, phase modulation or amplitude modulation.

12. The memory module of claim 9, wherein the clamp secures the coupling element in a nominal position relative to the system.

13. The memory module of claim 12, wherein the coupling element has a geometry that reduces sensitivity of the portion of symbol energy transferred to variations in the nominal position.

14. The system of claim 13, wherein the coupling element has a zig-zag geometry.

15. An apparatus comprising:
a transmitter, to encode a first plurality of bits received by the apparatus into a symbol;
a receiver to decode a transferred symbol received by the, apparatus into a second plurality of bits; and
a coupling element having, a geometry to enable a substantially reliable signal transfer between the coupling element and, a bus without significantly changing the impedance of the bus;
a substrate on which the transmitter, receiver, and coupling element are mounted, the substrate including a flexible portion on which the coupling element is mounted.

16. The apparatus of claim 15, further comprising a device to provide the first plurality of bits to the transmitter and to receive the second plurality of bits from the receiver.

17. The apparatus of claim 15, wherein the geometry of the coupling element is a zig-zag geometry.

18. The apparatus of claim 15, wherein the transmitter and the receiver support two or more modulation schemes selected from the list comprising phase modulation, pulse-width modulation, amplitude modulation, or rise-time modulation.

19. The apparatus of claim 18, wherein the selected modulation schemes are determined according to bit-intervals associated with each modulation scheme and a targeted symbol period.

20. The apparatus of claim 15, wherein the coupling element has a length-induced bandwidth of at least 5 Ghz.

* * * * *